(12) United States Patent
Sako

(10) Patent No.: US 8,883,601 B2
(45) Date of Patent: Nov. 11, 2014

(54) METHOD OF MANUFACTURING A SEMICONDUCTOR DEVICE HAVING A LAMINATED STRUCTURE COMPRISING A BORON-DOPED SILICON GERMANIUM FILM AND A METAL FILM

(71) Applicant: PS4 Luxco S.A.R.L., Luxembourg (LU)

(72) Inventor: Nobuyuki Sako, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/974,553

(22) Filed: Aug. 23, 2013

(65) Prior Publication Data

US 2013/0344674 A1    Dec. 26, 2013

Related U.S. Application Data

(63) Continuation of application No. 13/533,487, filed on Jun. 26, 2012, now Pat. No. 8,546,232.

(30) Foreign Application Priority Data

Jul. 4, 2011   (JP) ................. 2011-148255

(51) Int. Cl.
- *H01L 21/20* (2006.01)
- *H01L 21/36* (2006.01)
- *H01L 21/302* (2006.01)
- *H01L 21/461* (2006.01)
- *H01L 49/02* (2006.01)
- *H01L 27/108* (2006.01)

(52) U.S. Cl.
CPC .......... *H01L 28/91* (2013.01); *H01L 27/10852* (2013.01); *H01L 27/10894* (2013.01)
USPC .... 438/381; 438/478; 438/689; 257/E21.008; 257/E21.09; 257/E21.214; 257/E21.249

(58) Field of Classification Search
CPC ....................................... H01L 28/91
USPC ............... 438/381, 478, 689; 257/E21.008, 257/E21.09, E21.114, E21.249
See application file for complete search history.

(56) References Cited

U.S. PATENT DOCUMENTS

| | | |
|---|---|---|
| 2003/0141531 A1 | 7/2003 | Aihara |
| 2010/0248456 A1 | 9/2010 | Otsuka |

FOREIGN PATENT DOCUMENTS

| | | |
|---|---|---|
| JP | 2003-224204 | 8/2003 |
| JP | 2010-226022 | 10/2010 |

*Primary Examiner* — David S Blum
(74) *Attorney, Agent, or Firm* — Young & Thompson

(57) ABSTRACT

A semiconductor device has memory cell portions and compensation capacitance portions on a single substrate. The memory cell portion and the compensation capacitance portion have mutually different planar surface areas. The memory cell portion and the compensation capacitance portion include capacitance plate electrodes of the same structure. The capacitance plate electrode has a laminated structure including a boron-doped silicon germanium film and a metal film.

11 Claims, 25 Drawing Sheets

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

METHOD OF MANUFACTURING A SEMICONDUCTOR DEVICE HAVING A LAMINATED STRUCTURE COMPRISING A BORON-DOPED SILICON GERMANIUM FILM AND A METAL FILM

CROSS REFERENCE TO RELATED APPLICATIONS

This application is a continuation of application Ser. No. 13/533,487now U.S. Pat. No. 8,546,232, filed on Jun. 26, 2012, which is based upon and claims the benefit of priority from Japanese patent application No. 2011-148255, filed on Jul. 4, 2011, the disclosure of which is incorporated herein in its entirety by reference.

BACKGROUND OF THE INVENTION

1. Field of the Invention

The present invention relates to a semiconductor device and to a method of manufacturing the same and, in particular, relates to a semiconductor device having memory cell portions and compensation capacitance portions on a single substrate and to a method of manufacturing the same.

2. Description of Related Art

As one of semiconductor devices, there is a DRAM (Dynamic Random Access Memory) having crown capacitors.

Since the shapes of lower and upper electrodes forming the crown capacitors are cubic, CVD (Chemical Vapor Deposition) excellent in step coverage is used for forming the electrodes.

However, the treatment temperature is relatively high (e.g. 550 to 650° C.) in the CVD. As a consequence, there is a possibility that, during the formation of the upper electrode, reactions are induced between the lower electrodes and a capacitance insulating film, which have already been formed, and between the capacitance insulating film and the upper electrode which is being formed. These reactions cause a problem that the insulation of the capacitance insulating film is degraded to cause an increase in leakage current. In view of this, the formation of the upper electrode is carried out only for a minimum required time. Therefore, the upper electrode is thin and thus cannot fill up portions around the crown capacitors. As a result, spaces remain around (on the inner and outer peripheral sides of) the capacitors. These spaces should be filled up for the purpose of ensuring the mechanical strength and so on.

In a related semiconductor device, polysilicon is used for filling up spaces around crown capacitors (see, e.g. Patent Document 1: JP-A-2010-226022).

On the other hand, there is also known a semiconductor device using, as a capacitance plate electrode, silicon germanium (SiGe) containing a p-type impurity (e.g. boron) (see, e.g. Patent Document 2: JP-A-2003-224204).

The present inventor has recognized the following respects.

In the related semiconductor device, as described above, polysilicon is used for filling up the spaces around the crown capacitors. This polysilicon is made conductive so as to form a capacitance plate electrode. However, in order to make polysilicon conductive, a heat treatment of at least 600° C. is required for sufficiently activating an impurity introduced into the polysilicon. There is a possibility that such a high-temperature heat treatment promotes a reaction between an upper electrode and a capacitance insulating film to degrade the insulation of the capacitance insulating film more than the case where the upper electrode is formed by CVD.

On the other hand, silicon germanium containing a p-type impurity can be formed (made conductive) at a lower temperature as compared with polysilicon. However, there is a problem that its thickness should be made large in order to ensure the conductivity required for a semiconductor device.

SUMMARY

The present invention seeks to solve one or more or the above problems, or to improve upon those problems at least in part.

In one embodiment, there is provided a method of manufacturing a semiconductor device. The method comprises forming a plurality of cylinder-type capacitors in each of a memory cell forming region and a compensation capacitance forming region having different planar surface areas, forming a boron-doped silicon germanium film so as to fill up recesses of the capacitors, forming an adhesive layer on the boron-doped silicon germanium film, forming a metal film on the adhesive layer, forming a mask film on the metal film over the memory cell forming region and the compensation capacitance forming region, and etching the metal film, the adhesive layer, and the boron-doped silicon germanium film using the mask film as a mask, thereby removing the metal film, the adhesive layer, and the boron-doped silicon germanium film which are formed in a region other than the memory cell forming region and the compensation capacitance forming region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Before describing of the present invention, a reference example studied by the inventor will be explained in detail with reference to FIG. 1 in order to facilitate the understanding of the present invention.

As described above, the high-temperature treatment is required for making polysilicon conductive. In view of this, it is considered to use boron-doped silicon germanium (hereinafter referred to as "B—SiGe") which can be formed (made conductive) at a lower temperature as compared with polysilicon. In this case, in terms of reducing the number of processes and so on, a capacitance plate electrode is formed by a single-layer B—SiGe film.

Figure 1:
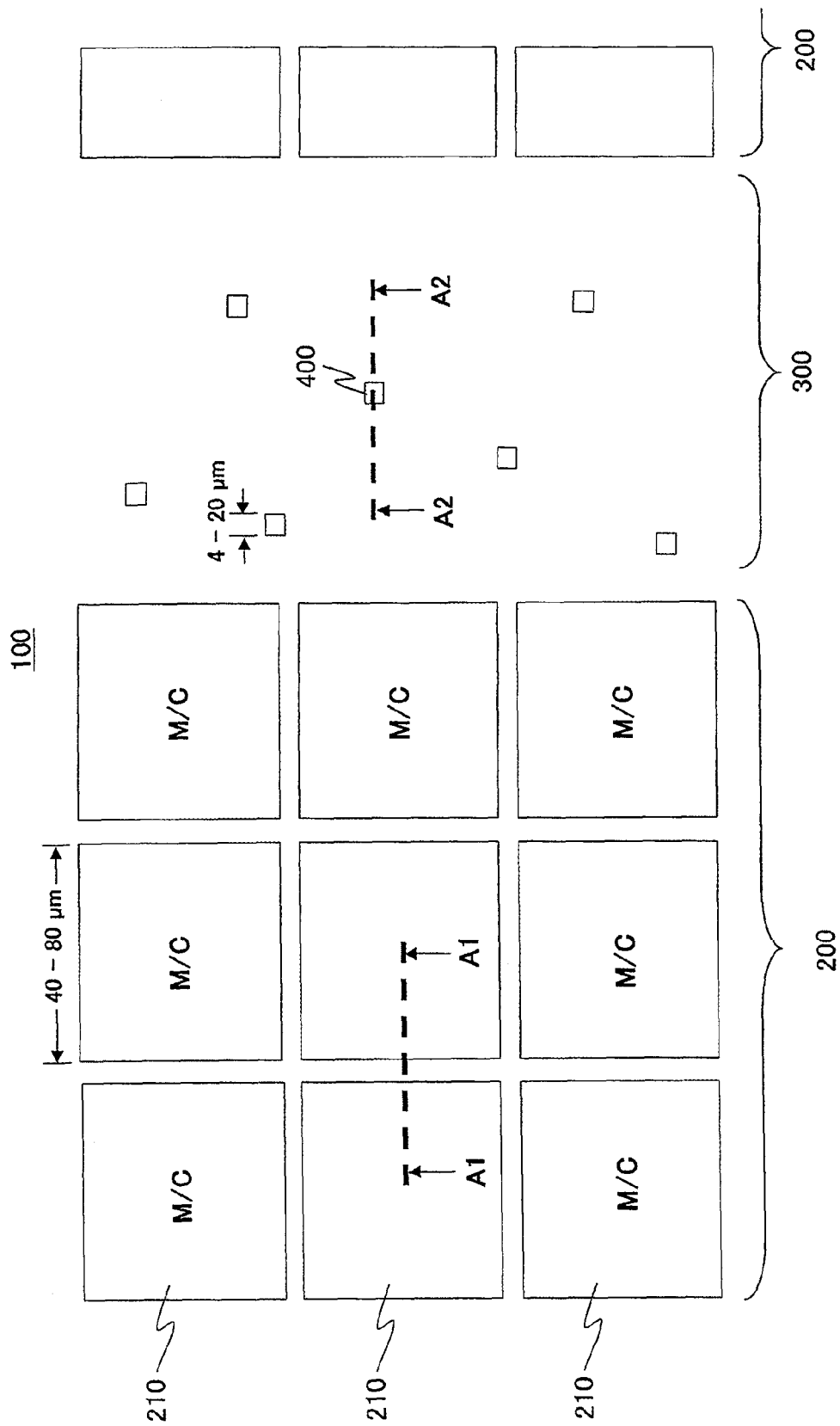
FIG. 1 is a plan view showing a schematic structure of part of a semiconductor device to which the present invention is applied.

Referring now to FIG. 1, a DRAM 100, which is one kind of semiconductor device, has a memory cell region 200 and a peripheral circuit region 300. The memory cell region 200 includes a plurality of arrayed memory cell portions (M/C) 210. Each memory cell portion 210 is also called a mat and includes a large number of arrayed memory cells. Each memory cell includes a crown capacitor. On the other hand, the peripheral circuit region 300 includes a plurality of compensation capacitance portions 400. Each compensation capacitance portion 400 includes a plurality of arrayed crown capacitors.

Each memory cell portion 210 is formed in a square memory cell portion forming region with each side having a length of about 40 to 80 μm. On the other hand, each compensation capacitance portion 400 is formed in a square compensation capacitance portion forming region with each side having a length of about 4 to 20 μm. Accordingly, the size of the compensation capacitance portion 400 is smaller by about one digit than that of the memory cell portion 210 and thus their planar surface areas are significantly different from each other. Further, the memory cell portions 210 occupy most of the memory cell region 200 while the compensation capacitance portions 400 are sparsely present in the peripheral circuit region 300.

FIGS. 2 to 8 are diagrams for explaining manufacturing processes of the DRAM 100. In each figure, (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.

Figure 2:
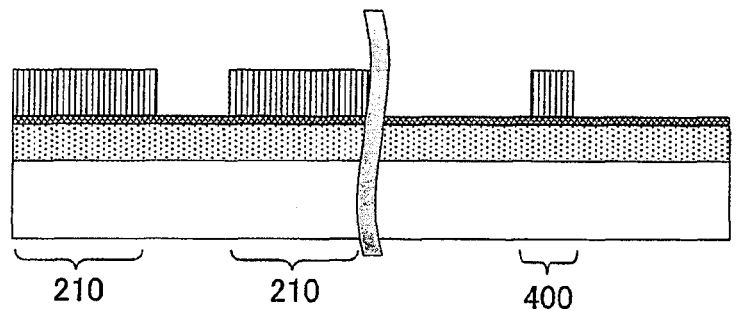
FIG. 2 is a diagram for explaining a manufacturing process of a semiconductor device according to a reference example studied by the inventor, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 2:
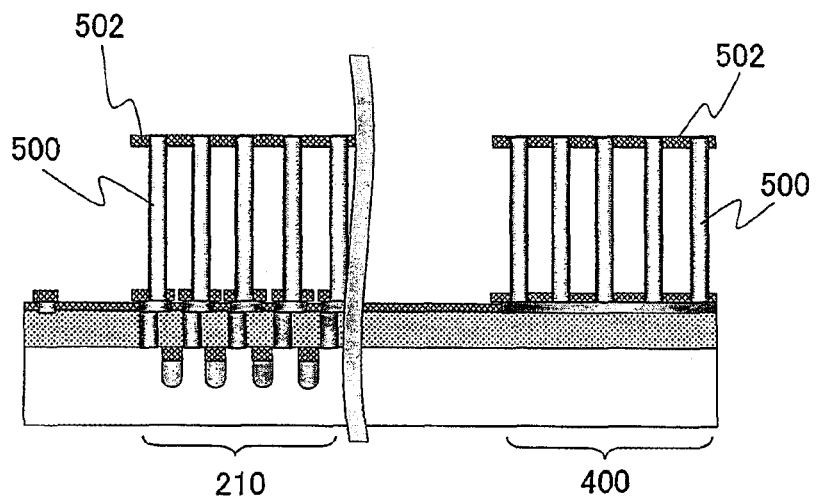

FIG. 2, (a) and (b) show a state where capacitors (cylinders) 500 of the same structure are formed in each memory cell portion 210 and each compensation capacitance portion 400. These capacitors 500 are simultaneously formed by the same process. Upper portions of the capacitors 500 are connected to each other by a support film 502. The support film 502 has a plurality of openings and thus does not completely close upper portions of spaces between the capacitors 500.

Figure 3:
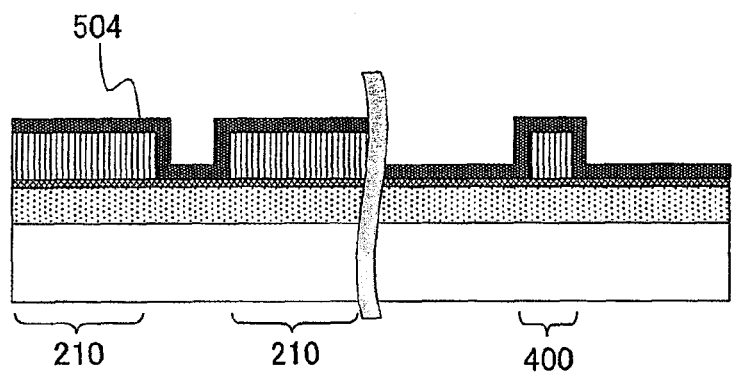
FIG. 3 is a diagram for explaining a process following the process shown in FIG. 2, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 3:
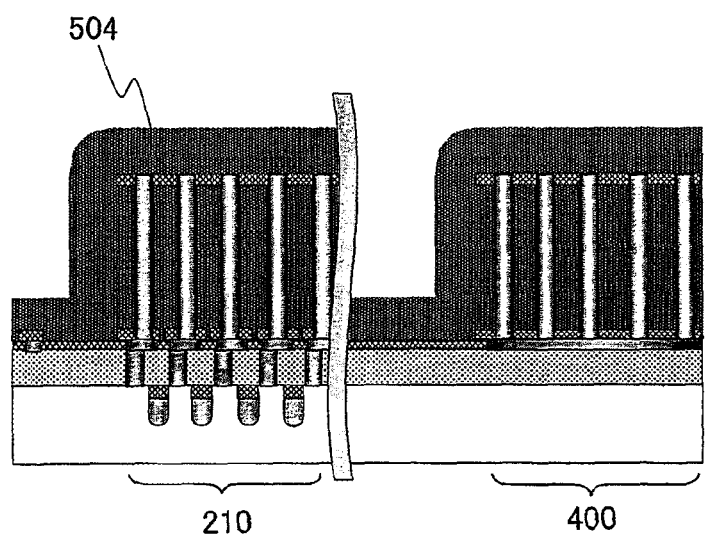

After the formation of the capacitors 500, a B—SiGe film 504 is formed so as to fill up spaces around the capacitors 500 as shown in FIG. 3, (a) and (b). Likewise, the formation of the B—SiGe film 504 is carried out simultaneously by the same process for the memory cell portions 210 and the compensation capacitance portions 400.

The B—SiGe film 504 can be formed at a lower temperature as compared with polysilicon. However, since the B—SiGe film 504 has a resistivity which is about 10 times that of a metal, a relatively large thickness of about 1000 nm is required for obtaining the required conductivity.

Figure 4:
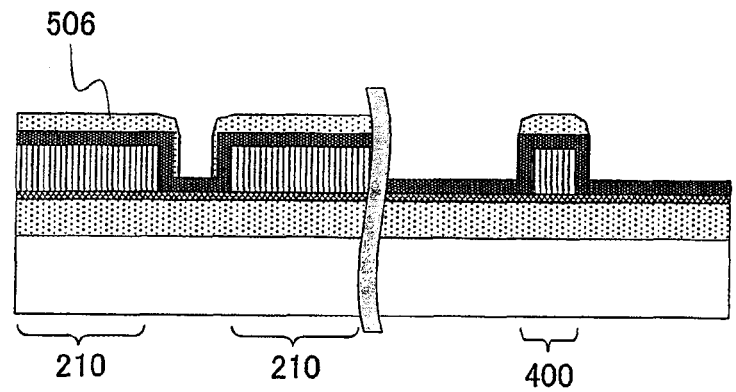
FIG. 4 is a diagram for explaining a process following the process shown in FIG. 3, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 4:
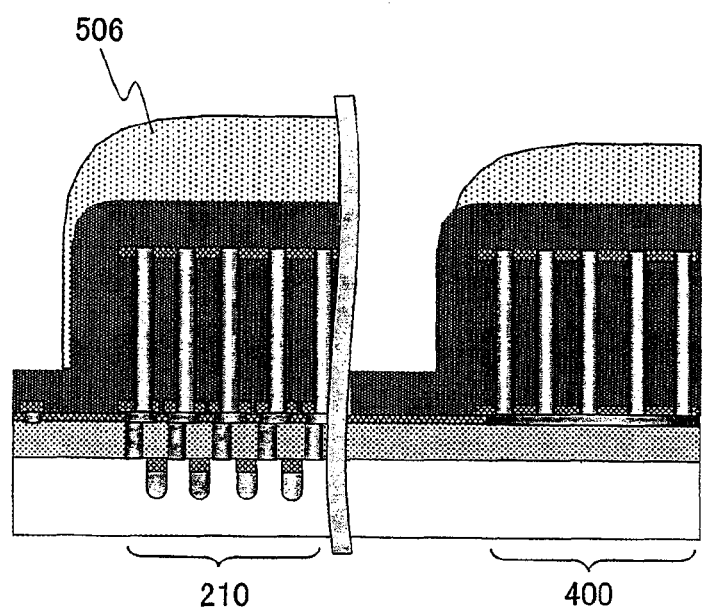

Then, in order to selectively remove the B—SiGe film 504 formed in regions other than the memory cell portions 210 and the compensation capacitance portions 400, a photoresist film 506 is formed on the entire surface of the B—SiGe film 504. Then, the photoresist film 506 is exposed and developed so that, as shown in FIG. 4, (a) and (b), the photoresist film 506 only remains over the memory cell portions 210 and the compensation capacitance portions 400.

Herein, in order to prevent the photoresist film 506 from remaining between the memory cell portions 210, the photoresist film 506 is exposed rather overly. This rather over exposure does not raise a problem in the memory cell region 200 but raises a problem in the peripheral circuit region 300. That is, the exposure area is much smaller than the non-exposure area in the memory cell region 200 while the exposure area is much larger than the non-exposure area in the peripheral circuit region 300. Consequently, the photoresist film 506 formed over the compensation capacitance portions 400 in the peripheral circuit region 300 is unintentionally sensitized at its surface portions and its peripheral portions. Further, the photoresist film 506, which is spin-coated, tends to be thinner over the compensation capacitance portion 400 having the relatively small planar surface area than over the memory cell portion 210 having the relatively large planar surface area. As a result, as is also seen from FIG. 4, (a) and (b), while the photoresist film 506 after the development covers side walls of the B—SiGe film 504 in the memory cell portion 210, it exposes shoulder portions of the B—SiGe film 504 in the compensation capacitance portion 400.

Figure 5:
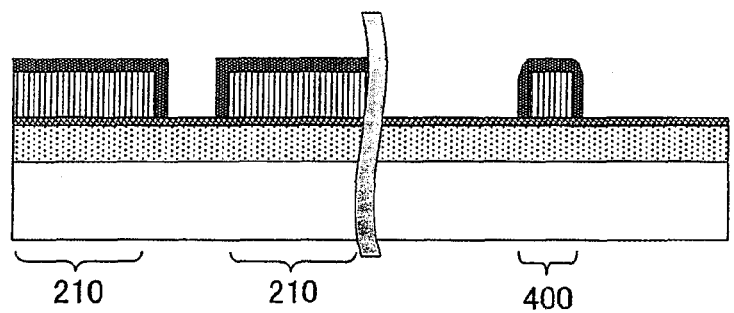
FIG. 5 is a diagram for explaining a process following the process shown in FIG. 4, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 5:
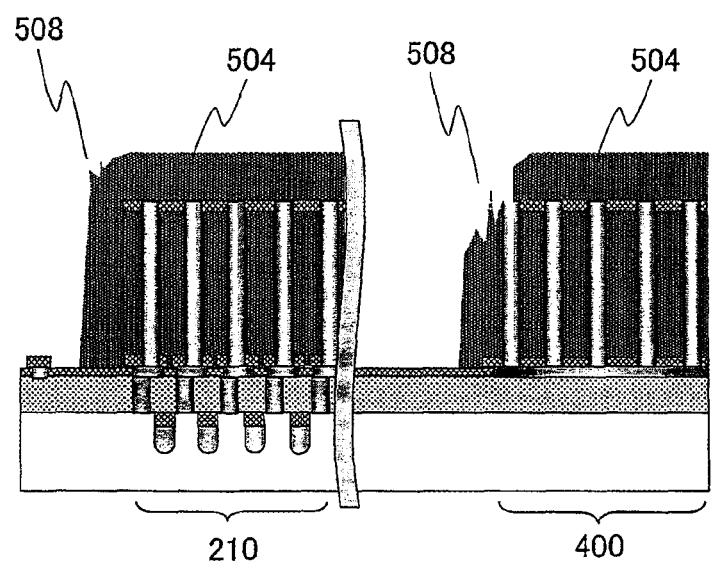

Then, using the photoresist film 506 after the development as a mask, the B—SiGe film 504 is dry-etched (etched back). Since the B—SiGe film 504 is formed thick as described above, the treatment time is long and thus the mask is also etched. As a result, as shown in FIG. 5, (a) and (b), shoulder portions of the photoresist film 506 are retreated during the dry etching so that shoulder portions 508 of the B—SiGe film 504 are also etched. In this event, there is a possibility that the capacitors 500 are exposed and do not function as capacitors in the compensation capacitance portions 400. Therefore, the B—SiGe film 504 should be formed further thicker in order to prevent the capacitors 500 from being exposed during the etching back.

Figure 6:
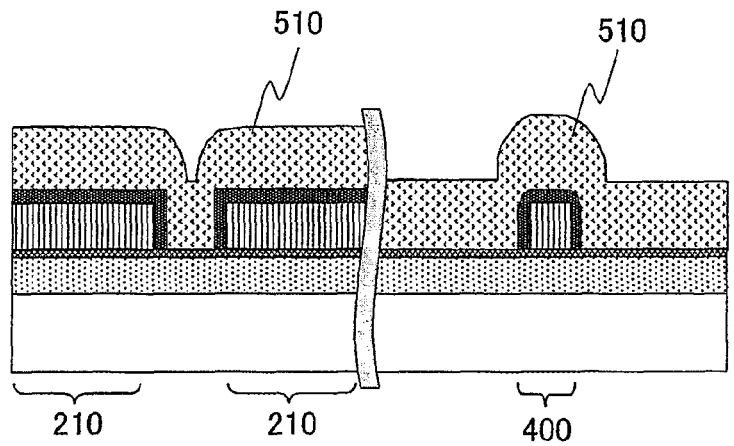
FIG. 6 is a diagram for explaining a process following the process shown in FIG. 5, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 6:
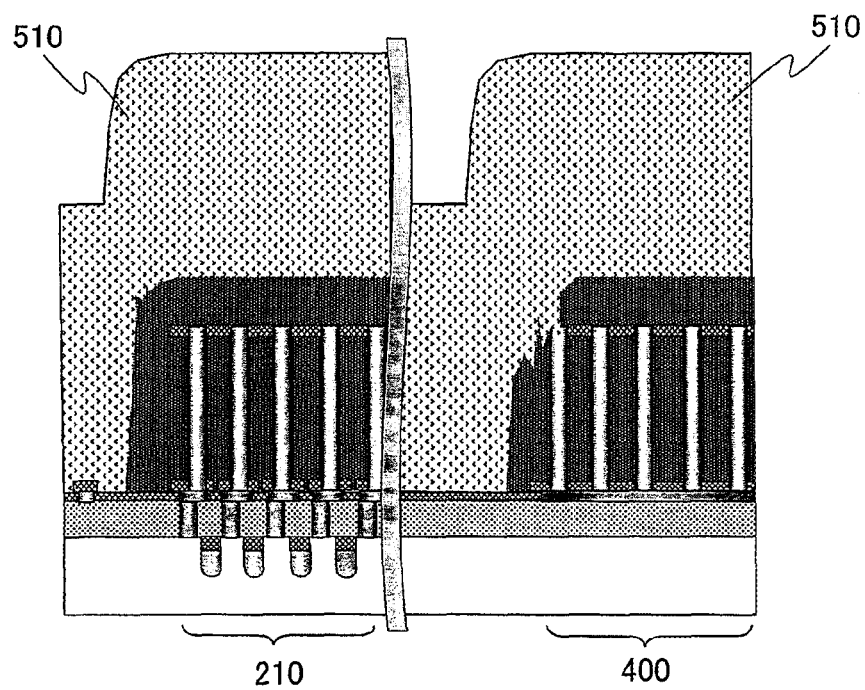

Thereafter, as shown in FIG. 6, (a) and (b), an interlayer insulating film 510 is formed. The aspect ratios of the memory cell portions 210 and the compensation capacitance portions 400 increase as the thickness of the B—SiGe film 504 increases, and therefore, the interlayer insulating film 510 that fills up spaces around them should also be formed thicker correspondingly.

Figure 7:
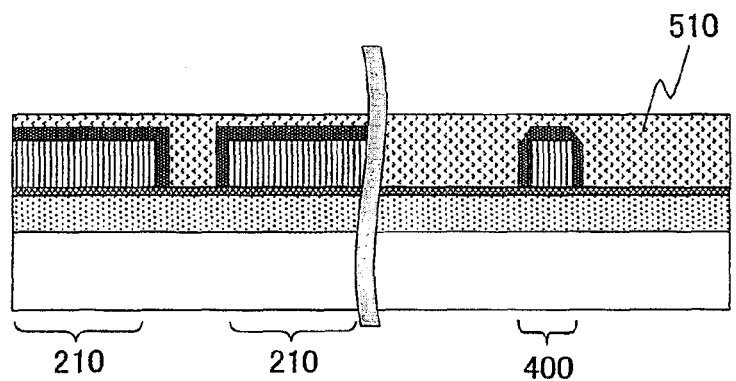
FIG. 7 is a diagram for explaining a process following the process shown in FIG. 6, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 7:
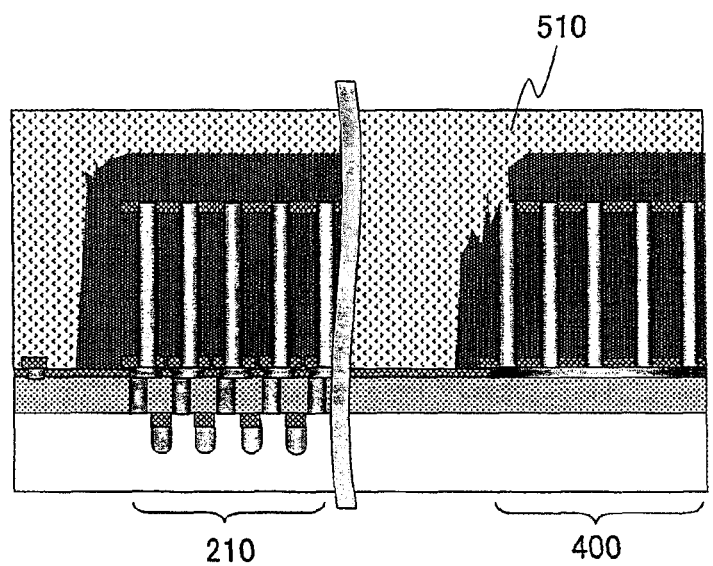

Subsequently, as shown in FIG. 7, (a) and (b), a surface of the interlayer insulating film 510 is flattened by polishing. The flattening requires a longer time as the interlayer insulating film 510 increases in thickness.

Figure 8:
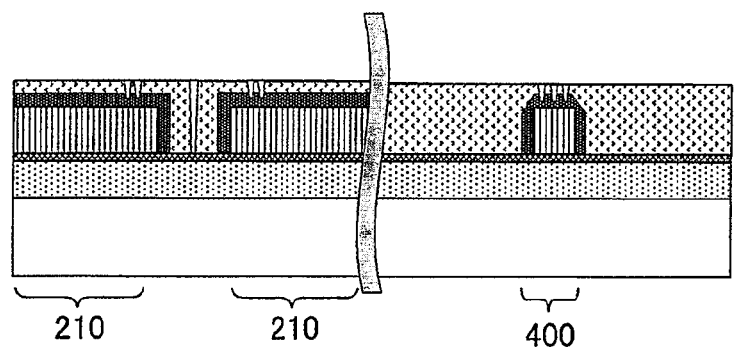
FIG. 8 is a diagram for explaining a process following the process shown in FIG. 7, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 8:
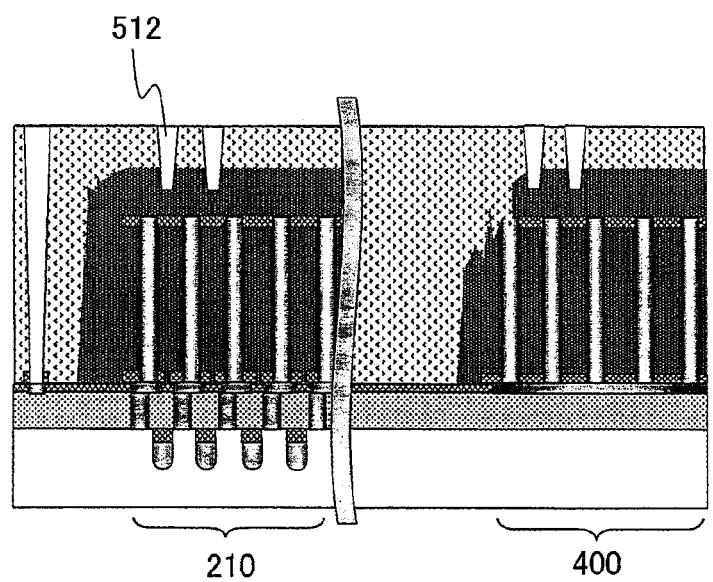

Then, as shown in FIG. 8, (a) and (b), through holes 512 and so on are formed which pass through the interlayer insulating film 510 to reach the B—SiGe film 504.

Thereafter, the formation of through electrodes, the formation of interconnections, the formation of a protective film, and so on are carried out. In this manner, the DRAM 100 is completed.

As described above, if the capacitance plate electrode is formed using the B—SiGe film alone, its thickness should be set large for obtaining the required conductivity and, in order to solve the problem that arises when such a thick B—SiGe film is etched back, its thickness should be further increased. In view of this, the present invention uses a metal film as part of a capacitance plate electrode. A low-resistance tungsten (W) film can be used as the metal film. However, if the W film is formed directly on a B—SiGe film, adhesion is poor so that the W film is stripped off. Therefore, the W film cannot be formed directly on the B—SiGe film. Consequently, in the present invention, an adhesive layer is interposed between the B—SiGe film and the metal film. As the adhesive layer, it is possible to use boron-doped silicon (B—Si) which exhibits excellent adhesion to both the B—SiGe film and the metal film.

The impurity in B—Si can be activated at a lower temperature as compared with polysilicon, but still a heat treatment of about 500° C. is required. This temperature is a temperature at which degradation of a capacitance insulating film, i.e. an increase in leakage current, starts. Therefore, it is not possible to fill up spaces around crown capacitors using B—Si instead of B—SiGe.

Hereinbelow, a first embodiment of the present invention will be described in detail with reference to the drawings.

Also in this embodiment, a DRAM is used as one example of a semiconductor device. However, the present invention is also applicable to other semiconductor devices. In each of FIGS. 9 to 15, (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.

Figure 9:
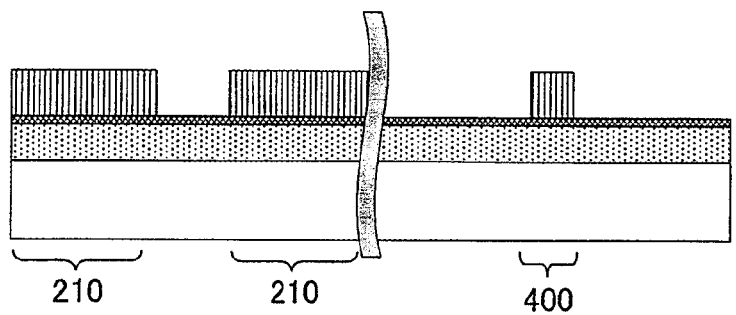
FIG. 9 is a diagram for explaining a manufacturing process of a semiconductor device according to a first embodiment of the present invention, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 9:
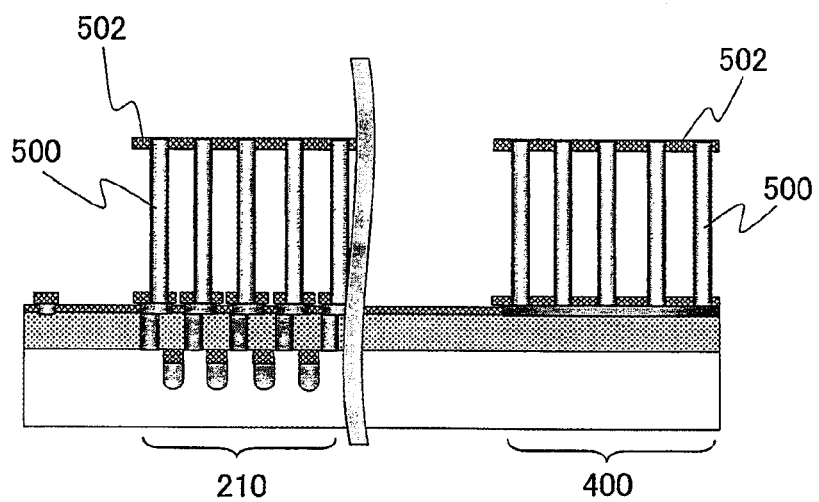

First, using a known method, as shown in FIG. 9, (a) and (b), a plurality of crown capacitors 500 are formed in array in each memory cell portion 210 and each compensation capacitance portion 400. All the capacitors 500 are simultaneously formed by the same process.

Figure 10:
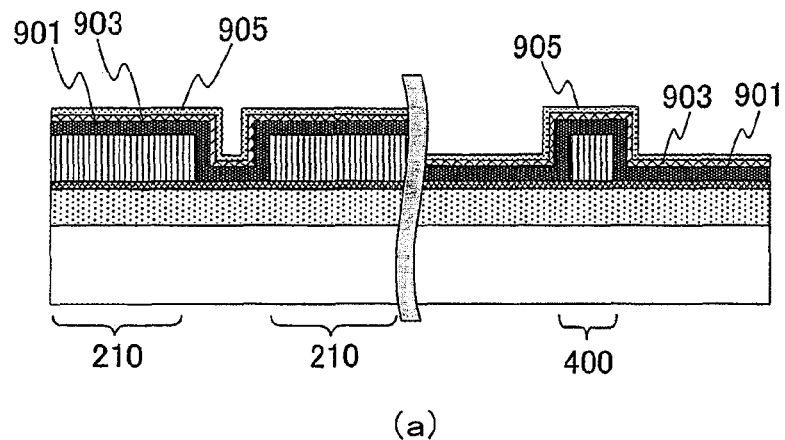
FIG. 10 is a diagram for explaining a process following the process shown in FIG. 9, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 10:
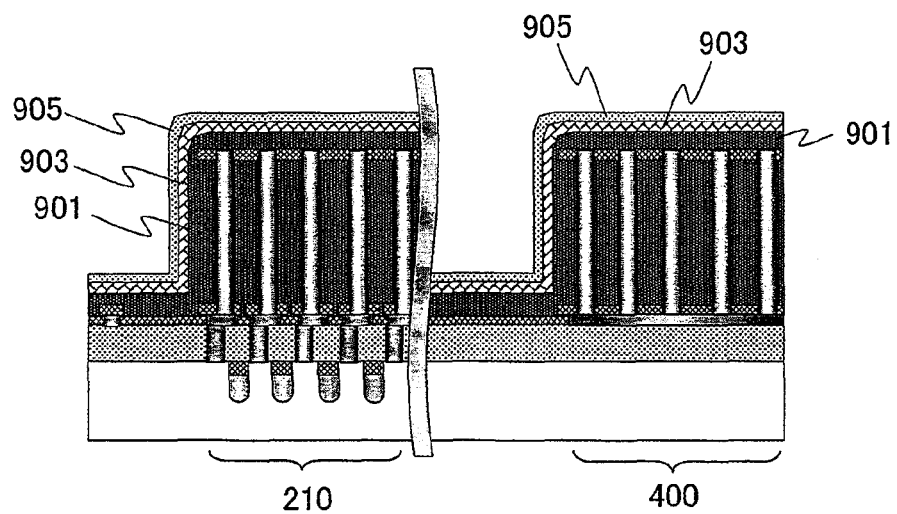

Then, as shown in FIG. 10, (a) and (b), a B—SiGe film 901 is formed overall so as to fill up spaces around the capacitors 500. As a consequence, a flat surface is formed by part of an upper surface of the B—SiGe film 901 over the capacitors 500 so as to cover the whole of each of the memory cell portions 210 and the compensation capacitance portions 400. Subsequently, a B—Si film 903 is formed as an adhesive layer on the B—SiGe film 901 so as to cover its upper surface including the above-mentioned flat surfaces and then a W film 905 is formed as a metal film on the B—Si film 903.

Figure 11:
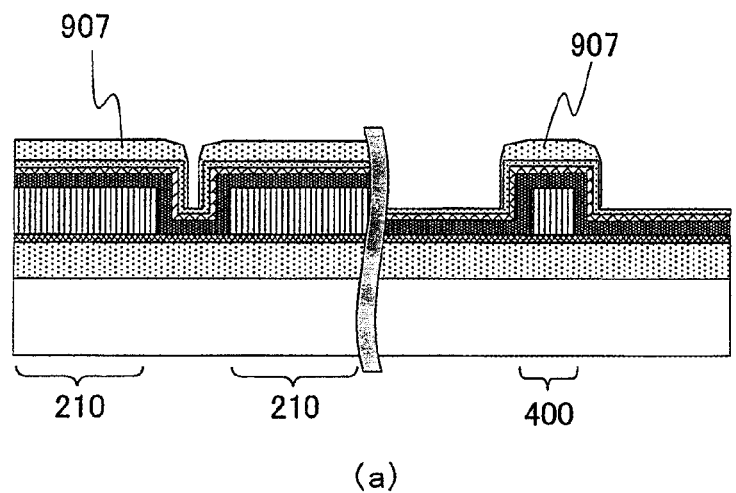
FIG. 11 is a diagram for explaining a process following the process shown in FIG. 10, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 11:
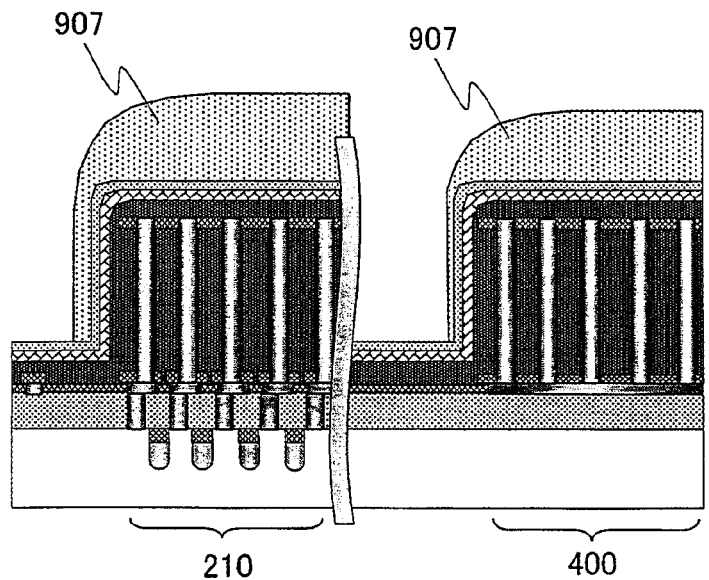

Then, a photoresist 907 is formed so as to cover the W film 905 and, as shown in FIG. 11, (a) and (b), the photoresist 907 is patterned. The patterned photoresist 907 remains over the memory cell portions 210 and the compensation capacitance portions 400 and on side walls thereof.

Figure 12:
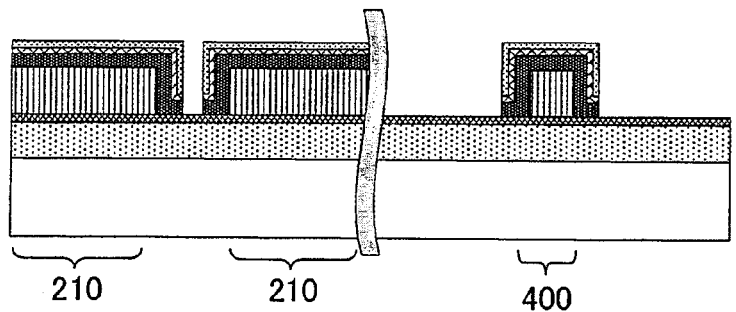
FIG. 12 is a diagram for explaining a process following the process shown in FIG. 11, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 12:
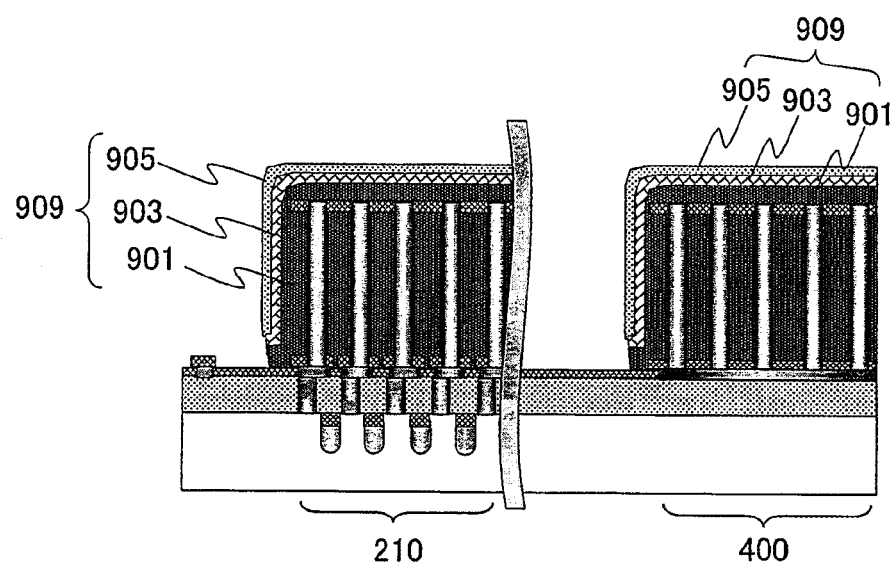

Then, using the remaining photoresist 907 as a mask, the W film 905, the B—Si film 903, and the B—SiGe film 901 are dry-etched. Then, the photoresist 907 is removed. As a result, as shown in FIG. 12, (a) and (b), a capacitance plate electrode 909 of a three-layer structure is formed in each of the memory cell portions 210 and the compensation capacitance portions 400.

Herein, during the dry etching, the retreat amount of the photoresist 907 is smaller than that of the B—SiGe film 901. That is, even after unnecessary portions of the B—SiGe film 901 are completely removed, the photoresist 907 covers shoulder portions of the compensation capacitance portions 400 to prevent etching thereof. Accordingly, it is not necessary to increase the thickness of the B—SiGe film 901 in anticipation of etching of the shoulder portions so as to avoid exposure of the capacitors 500. Consequently, the thickness of the B—SiGe film 901 can be reduced and thus the height of the capacitance plate electrode 909 can be lowered. Further, since the required conductivity can be ensured by the metal film 905, this also contributes to reducing the thickness of the B—SiGe film 901.

Figure 13:
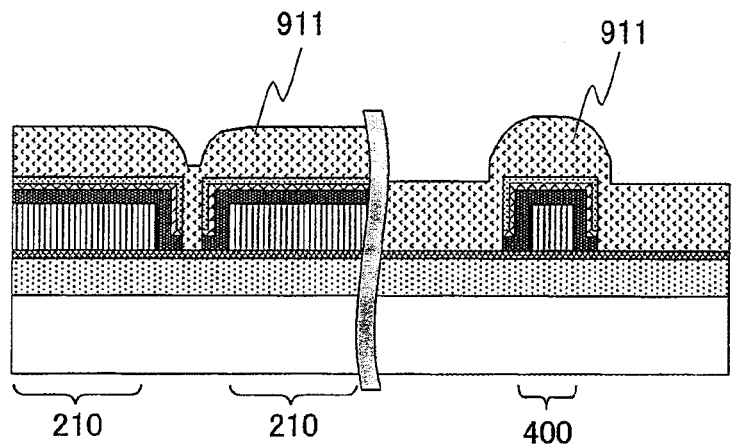
FIG. 13 is a diagram for explaining a process following the process shown in FIG. 12, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 13:
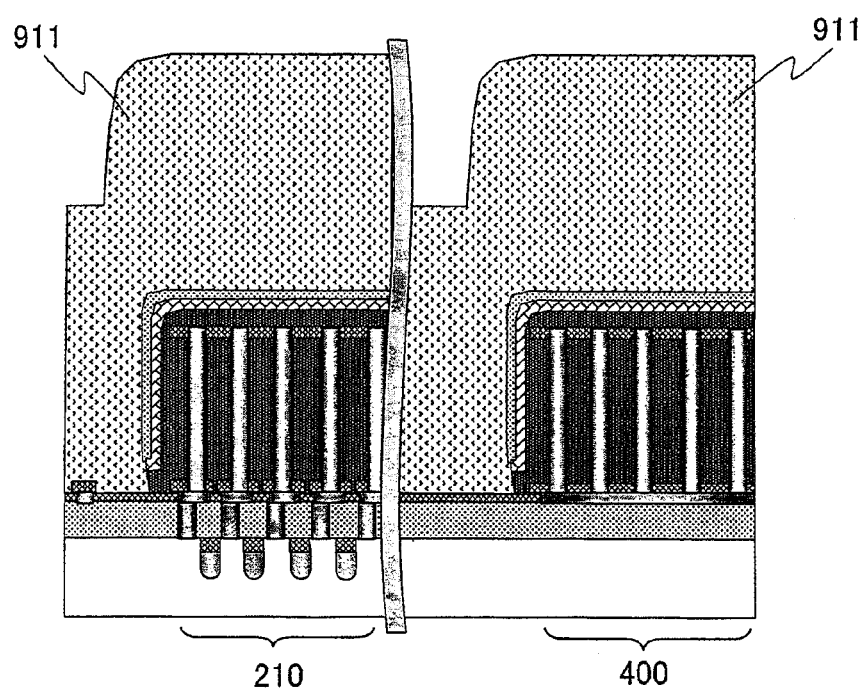

Then, as shown in FIG. 13, (a) and (b), an interlayer insulating film 911 which is thicker than the height of the memory cell portion 210 and the compensation capacitance portion 400 is formed. Since the capacitance plate electrode 909 is low as described above, the interlayer insulating film 911 can be made thinner than the interlayer insulating film 510 shown in FIG. 6. Accordingly, the difference in level formed on a surface of the interlayer insulating film 911 also becomes smaller.

Figure 14:
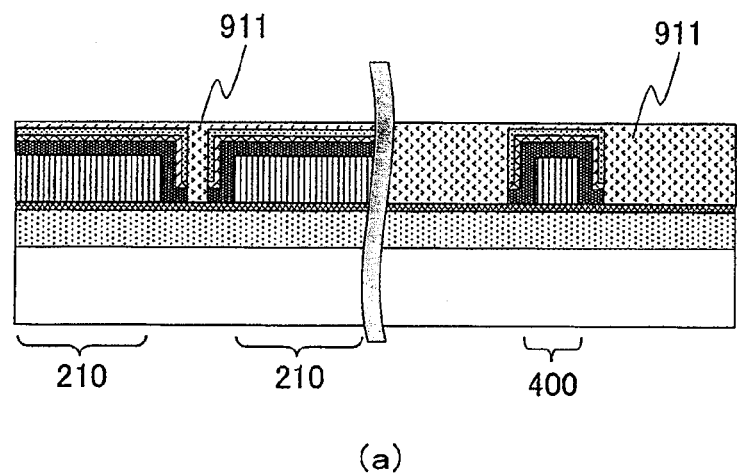
FIG. 14 is a diagram for explaining a process following the process shown in FIG. 13, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 14:
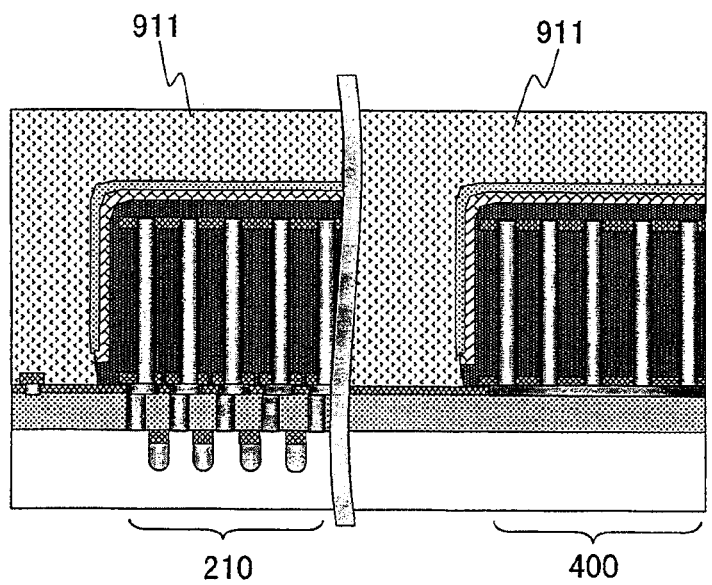

Then, as shown in FIG. 14, (a) and (b), the surface of the interlayer insulating film 911 is flattened. Since, as described above, the difference in level on the surface of the interlayer insulating film 911 is smaller as compared with the case of FIG. 6, the flattening thereof can also be carried out easily for a short time.

Figure 15:
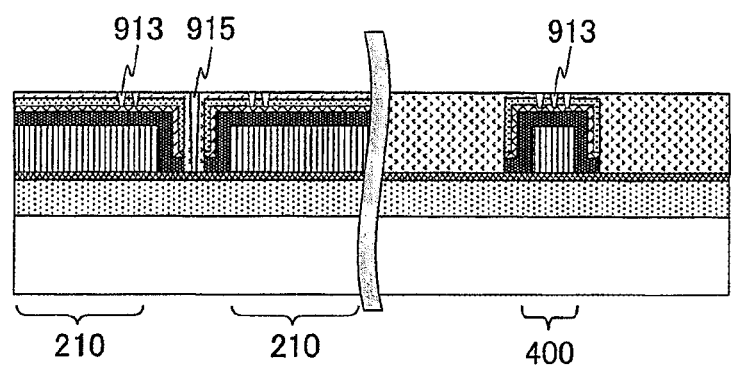
FIG. 15 is a diagram for explaining a process following the process shown in FIG. 14, wherein (a) is a diagram showing, side by side, a schematic longitudinal sectional view taken along line A1-A1 of FIG. 1 and a schematic longitudinal sectional view taken along line A2-A2 of FIG. 1 and (b) is a diagram showing part of (a) in an enlarged manner.
Figure 15:
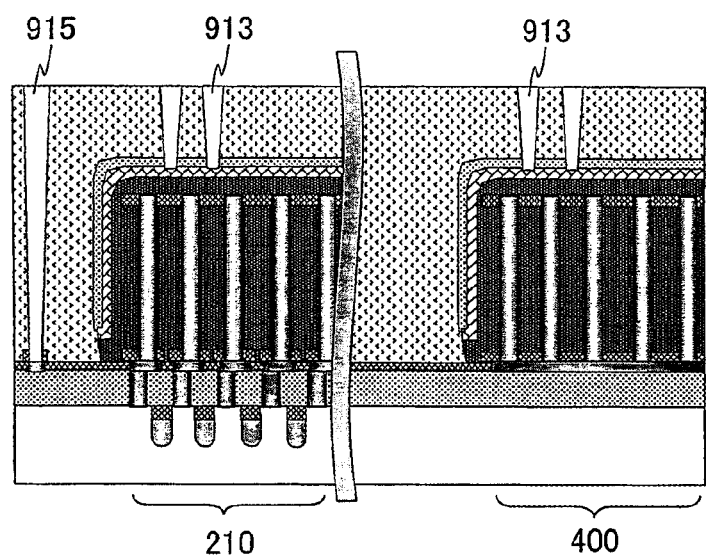

Subsequently, as shown in FIG. 15, (a) and (b), through holes 913 and 915 are formed. The formation of the through holes 913 and 915 can also be carried out easily due to the reduction in thickness of the interlayer insulating film 911.

Thereafter, the formation of through electrodes, the formation of interconnections, the formation of a protective film, and so on are carried out. In this manner, a DRAM is completed.

As described above, in the semiconductor device according to this embodiment, the capacitance plate electrode has the laminated structure of the B—SiGe film, the B—Si film, and the W film and this makes it possible to reduce the thickness thereof and to ensure the required conductivity.

The thickness of the W film may be set to, for example, 20 to 250 nm. If the thickness is too small, the electrical resistance becomes too large (e.g. 10Ω/square or more). On the other hand, if the thickness is too large, there arise problems of processability of the plate, flattening property of the plate, leakage current of the capacitors due to stress, and so on.

The B—Si film may be thin because it is only required to function as an adhesive layer. For example, its thickness may be set to 5 nm.

The B—SiGe film is required to have a thickness necessary for filling up the spaces around the cylinder-type capacitors.

The thickness of the B—SiGe film may be set to, for example, 100 nm or more. However, in consideration of the problems of processability of the plate, flattening property of the plate, leakage current of the capacitors due to stress, and so on, the thickness of the capacitance plate electrode (total thickness of three films) is set to about 20 to 30% of the height of the cylinder and, for example, does not exceed 350 nm.

EXAMPLE

Next, an Example of the present invention will be described. Also herein, a DRAM is used as a semiconductor device.

Figure 16:
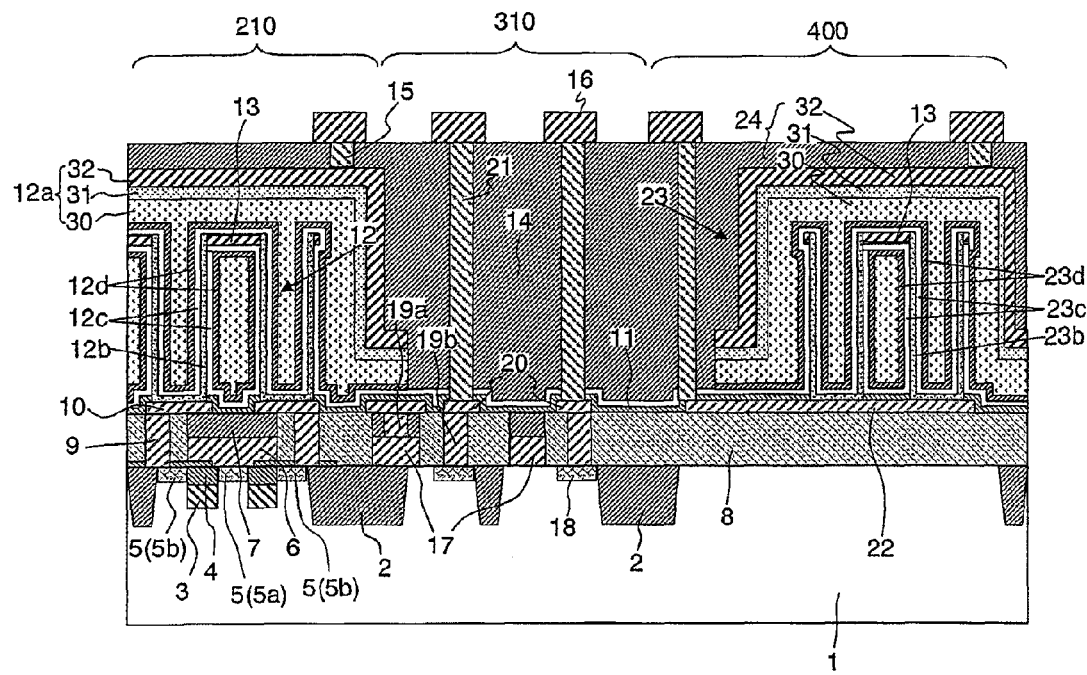
FIG. 16 is a longitudinal sectional view showing part of a DRAM according to an Example of the present invention.

FIG. 16 is a partial longitudinal sectional view of a DRAM according to this Example.

The illustrated DRAM has, on a semiconductor substrate (hereinafter referred to as a "substrate") 1 made of single-crystal silicon, a memory cell portion 210, a peripheral circuit portion 310 for driving the memory cell portion 210, and a compensation capacitance portion 400, which are respectively defined by STI (Shallow Trench Isolation) regions 2.

As described above with reference to FIG. 1, the memory cell portion 210 is formed in the memory cell region 200. The peripheral circuit portion 310 is, along with the compensation capacitance portion 400, formed in the peripheral circuit region 300 shown in FIG. 1.

The memory cell portion 210 and the compensation capacitance portion 400 both include capacitors. The capacitors of the memory cell portion 210 function as storage cells of the DRAM while the capacitors of the compensation capacitance portion 400 contribute to voltage stabilization of power supply lines and so on. In this manner, the capacitors of the memory cell portion 210 and the capacitors of the compensation capacitance portion 400 have the different functions, but these capacitors have the same structure and are simultaneously formed by the same process.

Next, the structure of the memory cell portion 210 will be described.

In the memory cell portion 210, buried gate electrodes 3 as word lines are formed on the front surface side of the substrate 1. In FIG. 16, the two gate electrodes 3 are shown.

Each buried gate electrode 3 is buried in a gate trench which is formed on the surface of the substrate 1 and whose inner surfaces are covered with a gate insulating film (not illustrated). Further, an upper surface of each buried gate electrode 3 is covered with a cap insulating film 4.

On both sides of each gate trench receiving therein the buried gate electrode 3, diffusion layers 5 are formed in the surface of the substrate 1. A buried-gate MOS transistor is formed by the two diffusion layers 5, and the gate insulating film and the buried gate electrode 3 in the gate trench sandwiched between the two diffusion layers 5. One of the two diffusion layers 5 (the diffusion layer 5 sandwiched between the two gate trenches; hereinafter also referred to as a "first diffusion layer 5a") serves as a common component of the two transistors adjacent to each other. The other of the two diffusion layers 5 (hereinafter also referred to as a "second diffusion layer 5b") serves as a component of each of the two transistors adjacent to each other.

The first diffusion layer 5a is connected to a bit line 6. A cover insulating film 7 is formed on an upper surface of the bit line 6. A first interlayer insulating film 8 is formed so as to cover the bit line 6 and the cover insulating film 7. Capacitance contact plugs 9 are formed through the first interlayer insulating film 8 so as to be connected to the second diffusion layers 5b, respectively.

A capacitance contact pad 10 is formed on an upper surface of each capacitance contact plug 9. A silicon nitride film 11 is formed so as to cover the capacitance contact pads 10.

Lower electrodes 12b of a crown structure are formed which pass through the silicon nitride film 11 so as to be connected to upper surfaces of the capacitance contact pads 10, respectively. Upper portions of the lower electrodes 12b are coupled together by a support film 13, thereby preventing collapse of the individual lower electrodes 12b.

A capacitance insulating film 12c is formed on inner and outer surfaces of the lower electrodes 12b, upper and lower surfaces of the support film 13, and an upper surface of the silicon nitride film 11. An upper electrode 12d is formed so as to cover a surface of the capacitance insulating film 12c.

The capacitance contact pads 10 correspond to the respective transistors and are independent of each other. The lower electrodes 12b connected to these capacitance contact pads 10 are also independent of each other. These lower electrodes 12b, jointly with the capacitance insulating film 12c and the upper electrode 12d, form a plurality of independent cell capacitance elements 12.

A B—SiGe film 30 is formed so as to fill up inner and outer spaces of the cell capacitance elements 12. A B—Si film 31 is formed so as to cover a surface of the B—SiGe film 30. A W film 32 is formed so as to cover a surface of the B—Si film 31. A cell capacitance plate electrode 12a is formed by the B—SiGe film 30, the B—Si film 31, and the W film 32.

A second interlayer insulating film 14 is formed so as to cover the W film 32. A first via plug 15 is formed which passes through the second interlayer insulating film 14 so as to be connected to an upper surface of the W film 32. A third interconnection 16 is formed so as to be connected to an upper surface of the first via plug 15.

Next, the structure of the peripheral circuit portion 310 will be described.

The peripheral circuit portion 310 includes first interconnections 17 which are formed by the same layer as the bit line 6 and serve as planar gate electrodes, and further include diffusion layers 18.

A cover insulating film 7 is formed on upper surfaces of the first interconnections 17. A first interlayer insulating film 8 is formed so as to cover the cover insulating film 7 and the first interconnections 17.

A contact plug 19a passes through the cover insulating film 7 so as to be formed on an upper surface of each first interconnection 17. A contact plug 19b passes through the first interlayer insulating film 8 so as to be formed on an upper surface of each diffusion layer 18. Second interconnections 20 formed by the same layer as the capacitance contact pads 10 are respectively connected to upper surfaces of the contact plugs 19a and 19b.

A silicon nitride film 11 is formed so as to cover the second interconnections 20. A second interlayer insulating film 14 is formed on an upper surface of the silicon nitride film 11. Second via plugs 21 are formed which pass through the second interlayer insulating film 14 and the silicon nitride film 11 so as to be connected to upper surfaces of the second interconnections 20, respectively. Third interconnections 16 are formed so as to be connected to upper surfaces of the second via plugs 21.

Next, the structure of the compensation capacitance portion 400 will be described.

In the compensation capacitance portion 400, a first interlayer insulating film 8 is formed on the upper surface of the substrate 1 and a compensation capacitance lower plate electrode 22 is formed on an upper surface of the first interlayer insulating film 8. A silicon nitride film 11 is formed so as to cover the compensation capacitance lower plate electrode 22.

A plurality of lower electrodes 23b are formed which pass through the silicon nitride film 11 so as to be connected to an upper surface of the compensation capacitance lower plate electrode 22. The lower electrodes 23b also have a crown structure which is the same as that of the lower electrodes 12b forming the cell capacitance elements 12, and are formed by the same process as the lower electrodes 12b. Upper portions of the lower electrodes 23b are coupled together by a support film 13, thereby preventing collapse of the individual lower electrodes 23b.

A capacitance insulating film 23c is formed on inner and outer surfaces of the lower electrodes 23b, upper and lower surfaces of the support film 13, and an upper surface of the silicon nitride film 11. An upper electrode 23d is formed so as to cover a surface of the capacitance insulating film 23c. A single compensation capacitance element 23 is formed by the lower electrodes 23b sharing the compensation capacitance lower plate electrode 22, the capacitance insulating film 23c, and the upper electrode 23d.

A B—SiGe film 30 is formed so as to fill up inner and outer spaces of the compensation capacitance element 23. A B—Si film 31 is formed so as to cover a surface of the B—SiGe film 30. A W film 32 is formed so as to cover a surface of the B—Si film 31. A compensation capacitance upper plate electrode 24 is formed by the B—SiGe film 30, the B—Si film 31, and the W film 32.

A second interlayer insulating film 14 is formed so as to cover the W film 32. A first via plug 15 is formed which passes through the second interlayer insulating film 14 so as to be connected to an upper surface of the W film 32. A third interconnection 16 is formed so as to be connected to an upper surface of the first via plug 15.

As described above, the semiconductor device (DRAM) according to this Example is configured to have the memory cell portion 210 in which the plurality of cell capacitance elements 12 independently form individual cells, and the compensation capacitance portion 400 in which the plurality of capacitance elements are connected in parallel between the compensation capacitance lower plate electrode 22 and the compensation capacitance upper plate electrode 24, thereby forming the single compensation capacitance element 23 as a whole. The cell capacitance elements 12 of the memory cell portion 210 and the compensation capacitance element 23 of the compensation capacitance portion 400 have the crown structure as their basic structure and are simultaneously formed by the same process. All of the capacitance elements 12 and 23 are provided on the upper surface of the first interlayer insulating film 8 formed on the upper surface of the substrate 1.

In this semiconductor device (DRAM), the cell capacitance plate electrode 12a and the compensation capacitance upper plate electrode 24 are each formed by the three layers including the space-filling B—SiGe film 30, the B—Si film 31 serving as an adhesive layer, and the W film 32 serving as a low-resistance layer. According to this structure, since the W film 32 which is the low-resistance layer is used as part of the plate electrode, it is possible to reduce the thickness of the entire plate electrode. Further, when forming the plate electrodes, it is possible to avoid a problem that the lower electrode is exposed at a shoulder portion of the compensation capacitance portion 400, whose planar surface area is small, to cause a short with another conductor.

Next, referring to FIGS. 17 to 31, a manufacturing method of the semiconductor device shown in FIG. 16 will be described in detail.

Figure 17:
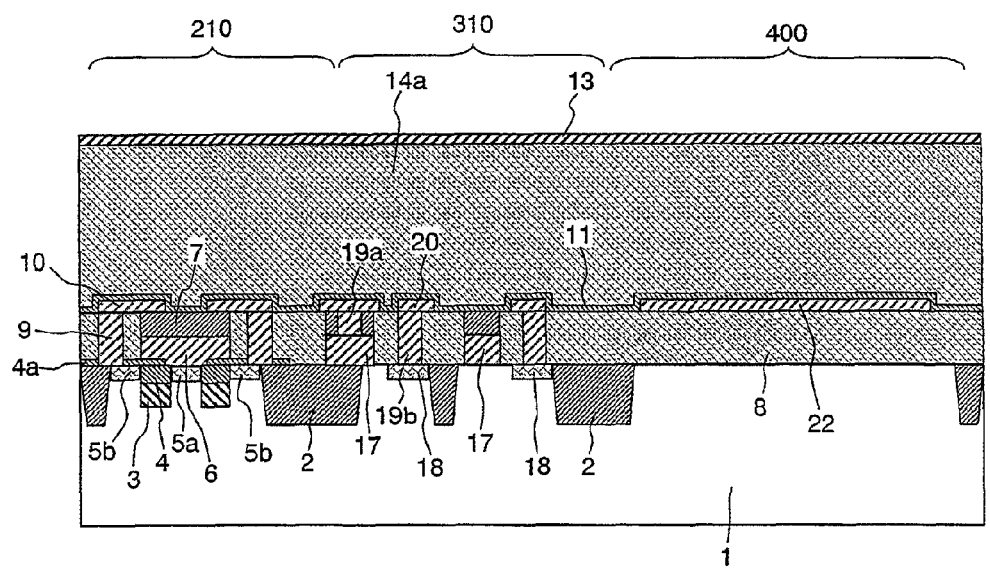
FIG. 17 is a longitudinal sectional view for explaining a method of manufacturing the DRAM of FIG. 16.

First, the state shown in FIG. 17 is obtained by a known method.

Specifically, the STI regions 2 where an insulating film is buried are formed in the substrate 1. Then, the gate trenches (not illustrated) are formed in the memory cell portion 210 and the gate insulating film (not illustrated) is formed on the inner surfaces of each gate trench. Then, a TiN film and a W film are formed in this order so as to fill the gate trenches and, by etching back, the buried gate electrodes 3 comprising the TiN film and the W film are formed. The buried gate electrodes 3 serve as word lines of the DRAM. Then, an upper space over each buried gate electrode 3 is filled with a silicon nitride film, thereby forming the cap insulating film 4 in the form of the silicon nitride film.

Then, an impurity such as phosphorus or arsenic is introduced into the memory cell portion 210 by ion implantation, thereby forming the diffusion layers 5 (first and second diffusion layers 5a and 5b). An insulating film 4a is formed in the memory cell portion 210 and then part of the insulating film 4a located on the first diffusion layer 5a is removed by lithography and dry etching.

In the memory cell portion 210, the bit line 6 is formed and the cover insulating film 7 is formed thereon. Simultaneously, by the same process, the first interconnections 17 are formed and the cover insulating film 7 is formed thereon in the peripheral circuit portion 310. The first interconnections 17 also serve as gate electrodes of planar transistors.

Then, the diffusion layers 18 are formed in the peripheral circuit portion 310. Subsequently, the first interlayer insulating film 8 is formed so as to cover the bit line 6 and the first interconnections 17. The capacitance contact plugs 9 and the contact plugs 19b are formed through the first interlayer insulating film 8 so as to be connected to the diffusion layers 5 and 18, respectively. Simultaneously, the contact plugs 19a are also formed so as to be connected to the planar gate electrodes 17, respectively.

Then, a W film having a thickness of, for example, 50 nm is formed overall by sputtering. A mask film (not illustrated) is formed on the W film by lithography and then the W film is dry-etched using the formed mask film as a mask. Consequently, the capacitance contact pads 10 connected to the capacitance contact plugs 9 in the memory cell portion 210, the second interconnections 20 connected to the contact plugs 19a and 19b in the peripheral circuit portion 310, and the compensation capacitance lower plate electrode 22 in the compensation capacitance portion 400 are simultaneously formed by the same metal film. Thereafter, the mask film is removed.

Then, the silicon nitride film 11 having a thickness of, for example, 50 nm is formed overall by CVD. Further, a sacrificial interlayer insulating film 14a in the form of a silicon oxide film having a thickness of, for example, 1000 nm and the support film 13 in the form of a silicon nitride film having a thickness of, for example, 100 nm are stacked in this order by CVD.

In this manner, the state shown in FIG. 17 is obtained.

Figure 18:
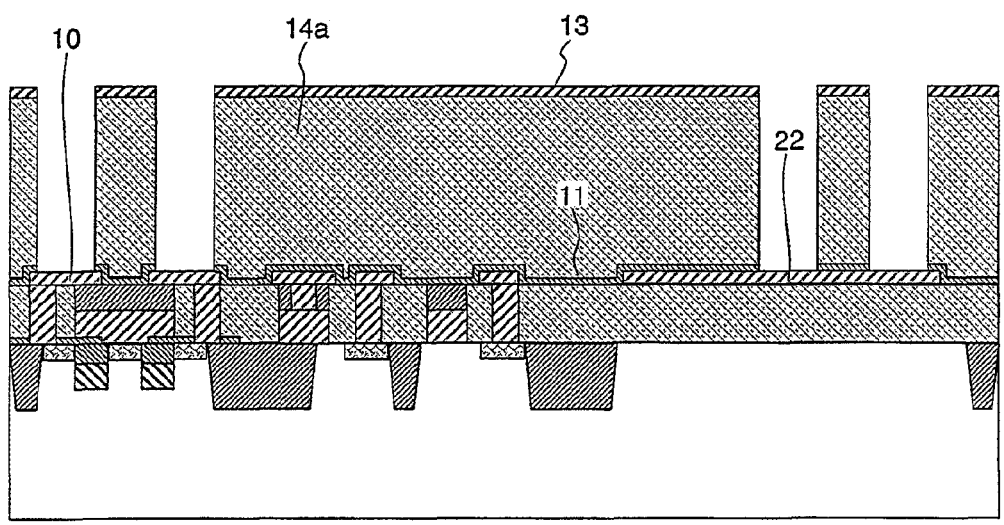
FIG. 18 is a longitudinal sectional view for explaining a process following the process shown in FIG. 17.

Then, as shown in FIG. 18, a plurality of cylinder holes are formed so as to pass through the support film 13, the sacrificial interlayer insulating film 14a, and the silicon nitride film 11. The formation of the cylinder holes is carried out in the following manner.

First, a mask film is formed on the support film 13 by lithography. A plurality of hole patterns each having a diameter of, for example, 80 nm are formed in the mask film at its predetermined positions.

Then, using the mask film as a mask, a plurality of cylinder holes passing through the support film 13, the sacrificial interlayer insulating film 14a, and the silicon nitride film 11 are formed by dry etching. The cylinder holes are formed in the memory cell portion 210 and the compensation capacitance portion 400. In the memory cell portion 210, the upper surfaces of the individually independent capacitance contact pads 10 are exposed in the cylinder holes, respectively. In the compensation capacitance portion 400, the upper surface of the integrally formed compensation capacitance lower plate electrode 22 is exposed in the cylinder holes.

Figure 19:
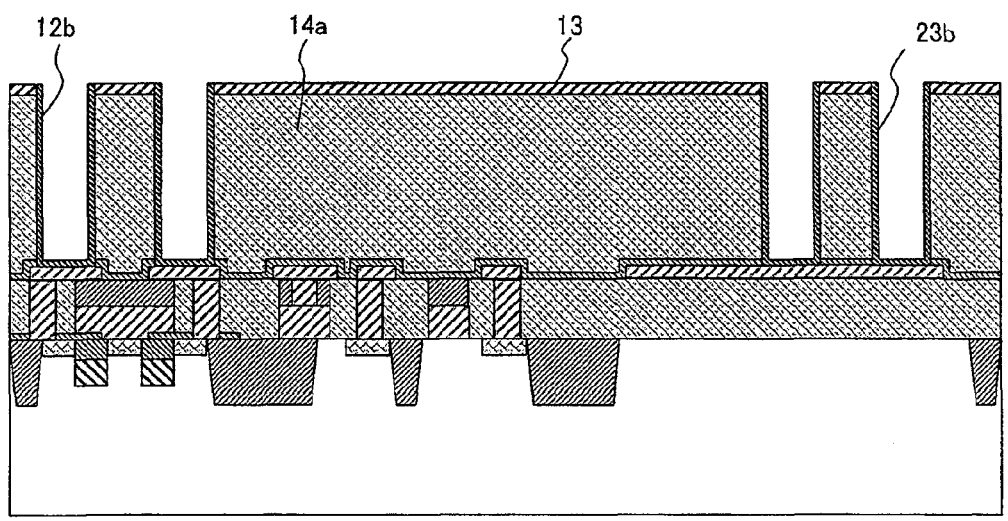
FIG. 19 is a longitudinal sectional view for explaining a process following the process shown in FIG. 18.

Then, as shown in FIG. 19, the lower electrodes 12b and 23b are formed so as to cover inner surfaces of the cylinder holes. The formation of these lower electrodes is carried out in the following manner.

First, using CVD, a TiN film having a thickness of, for example, 10 nm is formed overall including the inner surfaces of the cylinder holes. The formation of the TiN film can be carried out at a temperature of 650° C. using titanium tetrachloride and ammonia as material gases.

Then, the TiN film is subjected to overall etching back by dry etching using a chlorine-containing plasma, thereby removing the TiN film formed on the upper surface of the support film 13. Consequently, the TiN film remains in the cylinder holes and serves as the lower electrodes 12b and 23b.

If the diameter of the cylinder hole is 80 nm and the thickness of the TiN film is 10 nm, the inner diameter of the cylinder hole after the formation of the TiN film is 60 nm. The depth of the cylinder hole is 1150 nm in total of the thickness 50 nm of the silicon nitride film 11, the thickness 1000 nm of the sacrificial interlayer insulating film 14a, and the thickness 100 nm of the support film 13. Therefore, the aspect ratio (depth/diameter) of the cylinder hole before the overall etching back is about 19. In a hole with an aspect ratio exceeding 10, it is difficult to etch a to-be-etched object formed at the bottom of the hole by overall etching back with dry etching. In this Example, since the aspect ratio is about 19 which is a sufficiently large value, the TiN film formed at the bottom of the cylinder holes remains without being etched. Accordingly, the crown lower electrodes 12b and 23b can be formed without carrying out a particular process, such as filling the inside of the cylinder holes with a cover film, for the purpose of allowing the TiN film at the bottom of the cylinder holes to remain.

In the manner described above, the lower electrodes 12b made of the TiN film and connected to the capacitance contact pads 10 and the lower electrodes 23b also made of the TiN film and connected to the compensation capacitance lower plate electrode 22 are simultaneously formed.

Figure 20:
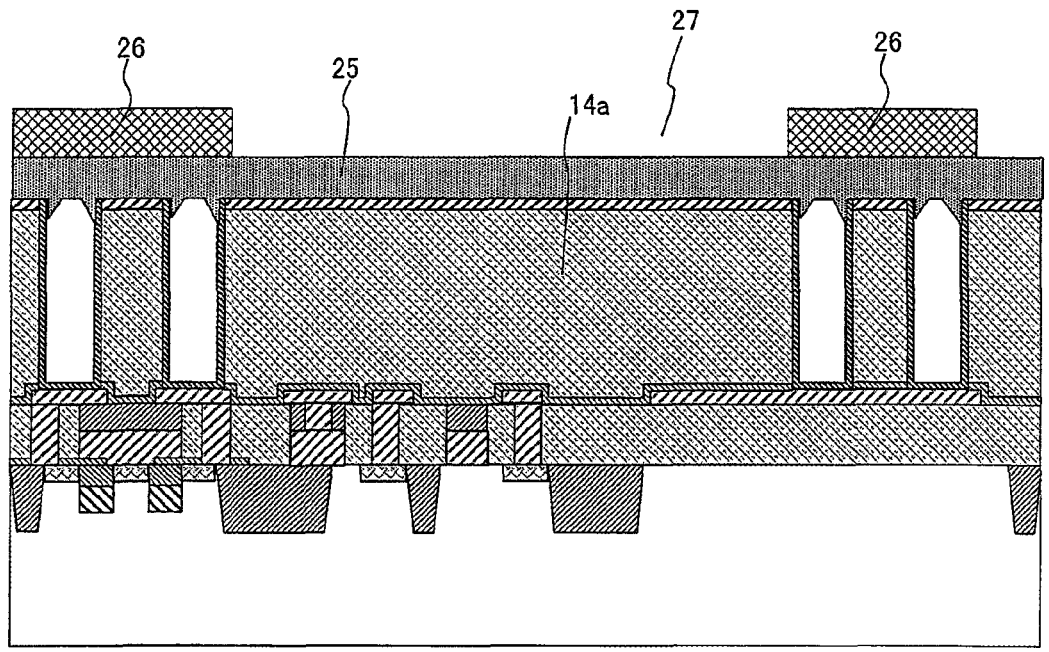
FIG. 20 is a diagram for explaining a process following the process shown in FIG. 19, wherein (a) is a partial longitudinal sectional view and (b) is a plan view of a memory cell portion.
Figure 20:
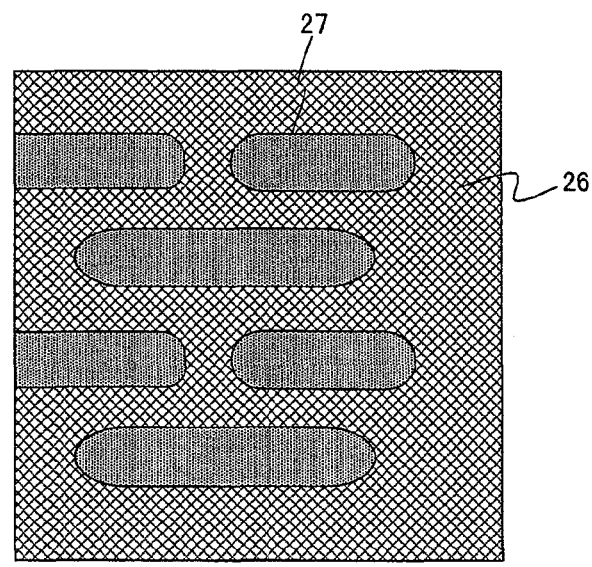

Then, as shown in FIG. 20, (a), a sacrificial film 25 is formed and then a photoresist film 26 is formed thereon.

The sacrificial film 25 is, for example, a silicon oxide film having a thickness of 100 nm. By forming the sacrificial film 25 by plasma CVD which is poor in step coverage, it is possible to close openings of the cylinder holes without filling up the inside thereof. The reason for closing the openings is to prevent the formation of the photoresist film 26 at the bottom of the cylinder holes. This is because if the photoresist film 26 is formed at the hole bottom, it is difficult to remove it later for the same reason as described above.

A plurality of openings 27 are formed in the photoresist film 26 by lithography. The openings 27 are formed in the memory cell portion 210 and the peripheral circuit portion 310.

FIG. 20, (b) is a plan view of the memory cell portion 210 in the state where the photoresist film 26 is formed. The openings 27 are formed at arbitrary positions in the memory cell portion (memory mat) 210. The openings 27 serve as inlets of an etchant when removing the sacrificial interlayer insulating film 14a by wet etching in a later process.

Then, using as a mask the photoresist film 26 formed with the openings 27, the sacrificial layer 25, at its portions where its upper surface is exposed, and the underlying support film 13 corresponding to those portions are removed by dry etching using a fluorine-containing plasma. Thereafter, the photoresist film 26 is removed. Consequently, the state shown in FIG. 21, (a) is obtained. In the support film 13, openings 27a are formed at positions corresponding to the openings 27.

Figure 21:
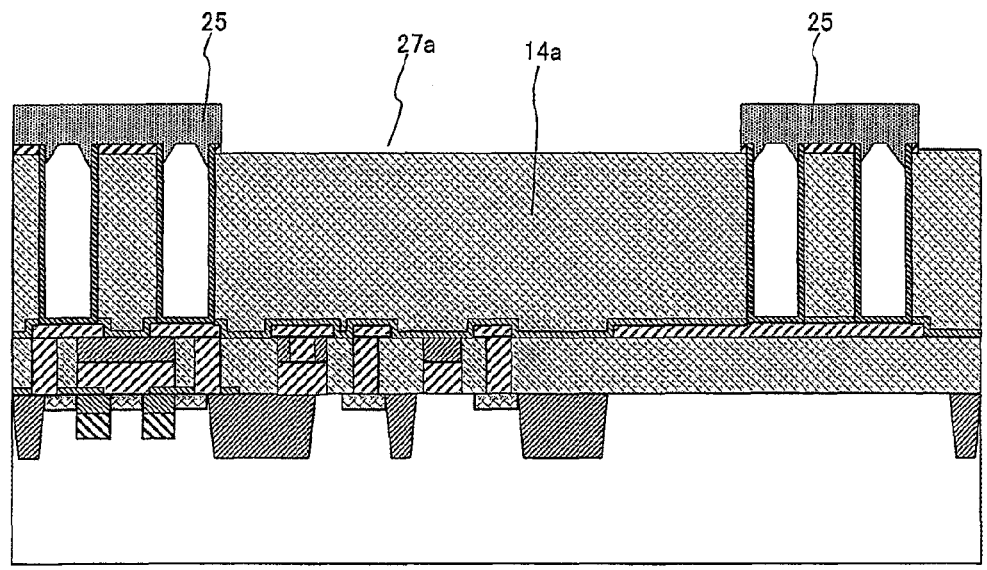
FIG. 21 is a diagram for explaining a process following the process shown in FIG. 20, wherein (a) is a partial longitudinal sectional view and (b) is a plan view of the memory cell portion.
Figure 21:
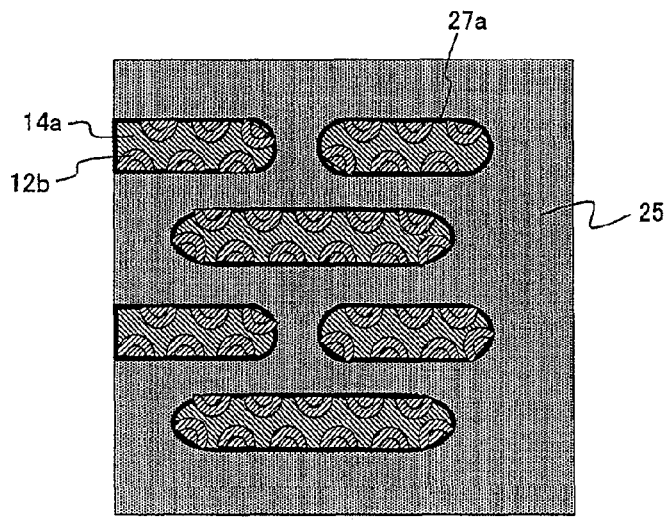

In each opening 27a, part of an upper surface of the sacrificial interlayer insulating film 14a and part of upper surfaces of the lower electrodes 12b are exposed in the memory cell portion 210. The forming positions of the openings 27a are set in the memory cell portion 210 such that, as shown in FIG. 21, (b), about half of the upper surface of each of the lower electrodes 12b is exposed. On the unexposed other half side of the lower electrodes 12b, the support film 13 in the form of the silicon nitride film remains so that the lower electrodes 12b are coupled together and supported by the support film 13.

Figure 22:
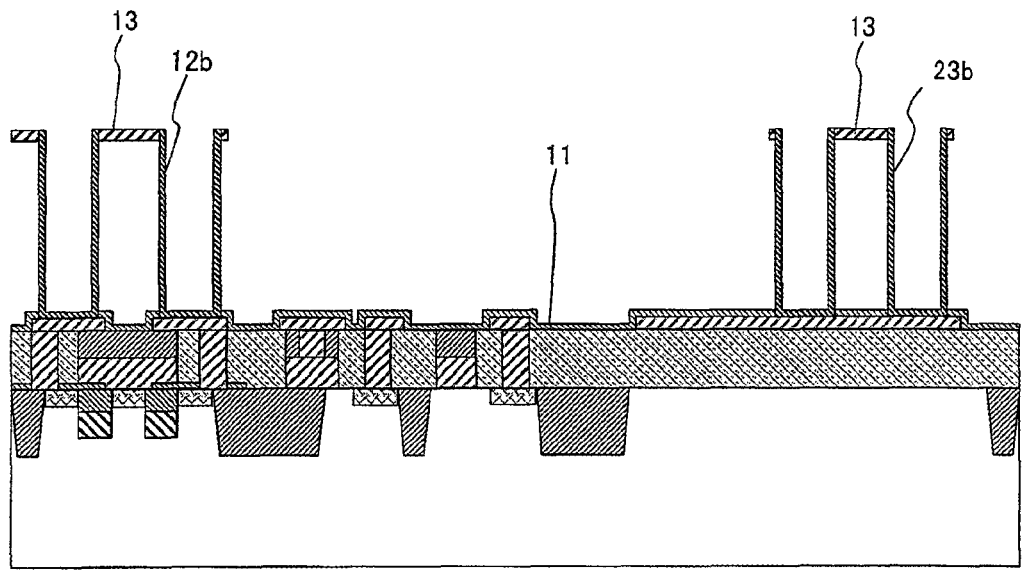
FIG. 22 is a diagram for explaining a process following the process shown in FIG. 21, wherein (a) is a partial longitudinal sectional view and (b) is a plan view of the memory cell portion.
Figure 22:
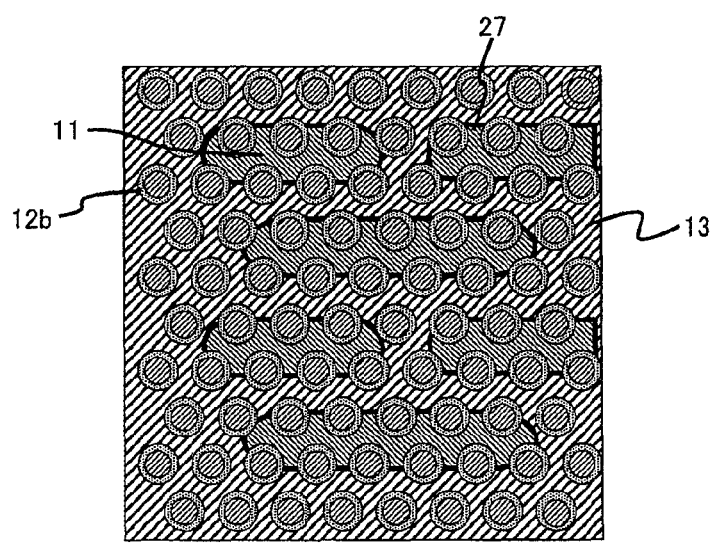

Then, as shown in FIG. 22, (a) and (b), the sacrificial layer 25 and the sacrificial interlayer insulating film 14a are all removed using a hydrofluoric acid-containing solution.

In the peripheral circuit portion 310, since the upper surface of the sacrificial interlayer insulating film 14a is exposed, the sacrificial interlayer insulating film 14a is sequentially wet-etched downward from its upper surface. On the other hand, in the memory cell portion 210, the sacrificial interlayer insulating film 14a is wet-etched from its outer peripheral side adjacent to the peripheral circuit portion 310. Simultaneously, in the memory cell portion 210, the sacrificial interlayer insulating film 14a is also wet-etched by the etchant entering through the openings 27a formed on its upper surface side. The etchant even reaches just below the support film 13 to remove the sacrificial interlayer insulating film 14a located there.

In the compensation capacitance portion 400, since its planar surface area is small, it is possible to remove the sacrificial interlayer insulating film 14a only by the etchant entering from its outer peripheral side adjacent to the peripheral circuit portion 310. Therefore, openings 27a as those formed in the memory cell portion 200 are not required.

Although the first interlayer insulating film 8 is in the form of a silicon oxide film, since its upper surface is covered with the silicon nitride film 11, the first interlayer insulating film 8 remains without being wet-etched. That is, the silicon nitride film 11 serves as an etching stopper film.

Figure 23:
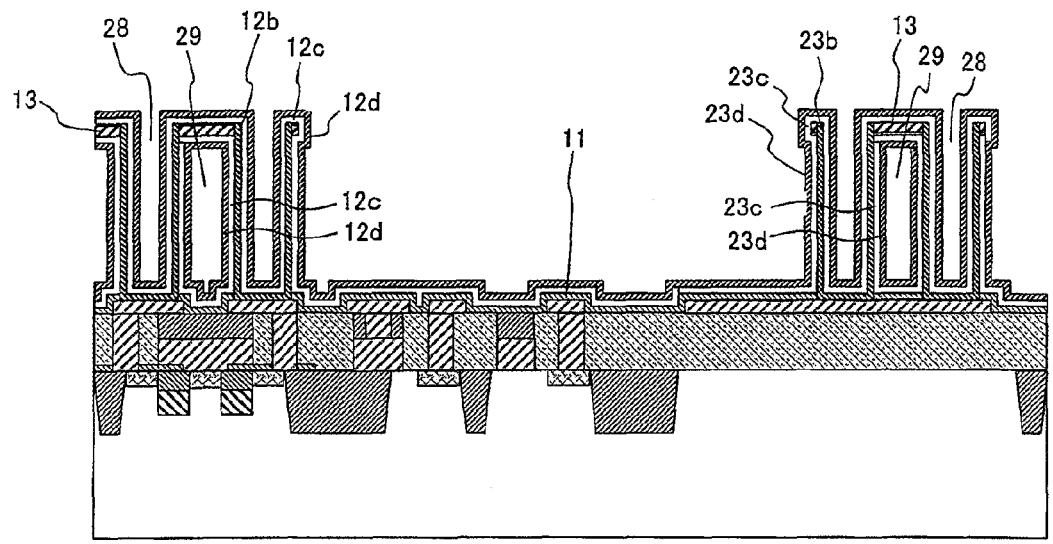
FIG. 23 is a longitudinal sectional view for explaining a process following the process shown in FIG. 22.

Then, as shown in FIG. 23, a zirconium oxide film is formed which serves as the capacitance insulating film 12c in the memory cell portion 210 and as the capacitance insulating film 23c in the compensation capacitance portion 400.

The zirconium oxide film is formed by ALD (Atomic Layer Deposition). According to this method, the zirconium oxide film is formed on all of the inner and outer surfaces of the lower electrodes 12b and 23b, the upper and lower surfaces of the support film 13, and the upper surface of the silicon nitride film 11. The thickness of the zirconium oxide film is set to, for example, 6 nm.

Instead of the zirconium oxide film, use may be made of, for example, one of a tantalum oxide film, a hafnium oxide film, and a lanthanum oxide film, which are metal oxide films each having a relative permittivity of 20 or more, or a laminated film thereof.

After forming the capacitance insulating film 12c, 23c, a TiN film is formed which serves as the upper electrode 12d in the memory cell portion 210 and as the upper electrode 23d in the compensation capacitance portion 400. The TiN film can be formed by CVD.

The formation of the TiN film is carried out at about 600° C. as the formation of the lower electrodes. At this temperature, the zirconium oxide film and the TiN film start to react with each other at a contact portion therebetween, thereby reducing the insulation performance of the zirconium oxide film. This increases the leakage current of the capacitors. Therefore, the formation of the TiN film which serves as the upper electrodes 12d and 23d cannot be carried out for a long time and thus the TiN film cannot be made thick. The thickness of the TiN film is about 10 nm at maximum. Consequently, with this TiN film, it is not possible to fill up portions around the capacitance elements (cylinder-type capacitors) and thus spaces exist around the capacitance elements.

Herein, it is assumed that the diameter of each cylinder hole after the formation of the lower electrode is 60 nm. If the thicknesses of the capacitance insulating film and the upper electrode, which will be formed thereafter, are 6 nm and 10 nm, respectively, there still exists a space (recess 28) with a diameter of 28 nm in each cylinder hole. Further, similar spaces (cavities 29) remain in a continuous manner around the lower electrodes 12b and 23b. These spaces adversely affect the capacitance elements and thus should be filled up. However, as described above, the upper electrode itself in the form of the TiN film cannot fill up those spaces. In view of this, in this Example, the boron-doped silicon germanium (B—SiGe) film 30 is used as a filling film.

Figure 24:
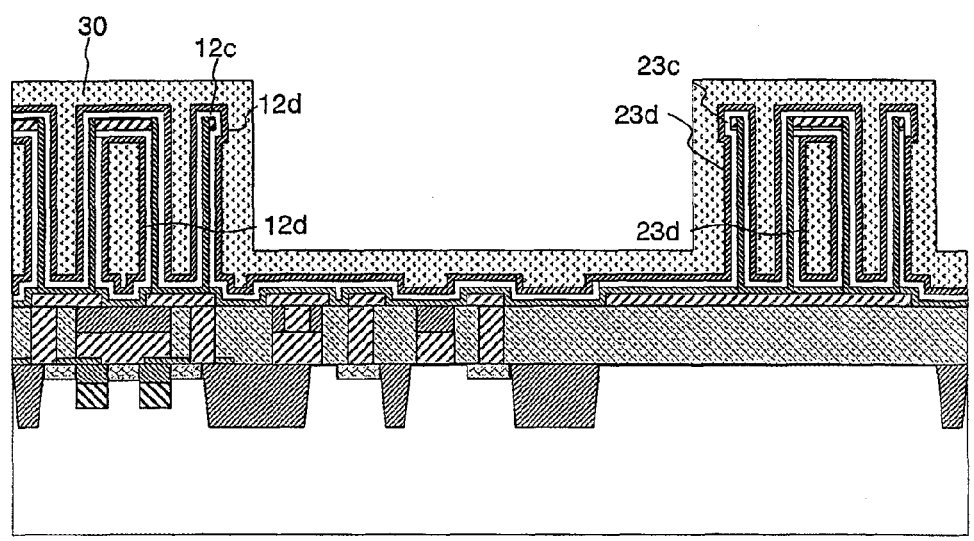
FIG. 24 is a longitudinal sectional view for explaining a process following the process shown in FIG. 23.

As shown in FIG. 24, the B—SiGe film 30 is formed by CVD. The B—SiGe film 30 is formed at 400 to 450° C. using boron trichloride ($BCl_3$), monosilane ($SiH_4$), and monogermane ($GeH_4$) as material gases. The film formation at the low temperature (400 to 450° C.) is enabled due to the catalytic effect of $BCl_3$ and $GeH_4$.

Since the reaction between the zirconium oxide film and the TiN film does not occur at 450° C., the thickness of the B—SiGe film 30 can be made large enough to fill up the spaces between the capacitance elements. In this Example, the B—SiGe film 30 has a thickness of, for example, 100 nm. The B—SiGe film 30 is already crystallized in a low-resistance state at the film formation stage. Therefore, a heat treatment for activating the impurity is not required.

Figure 25:
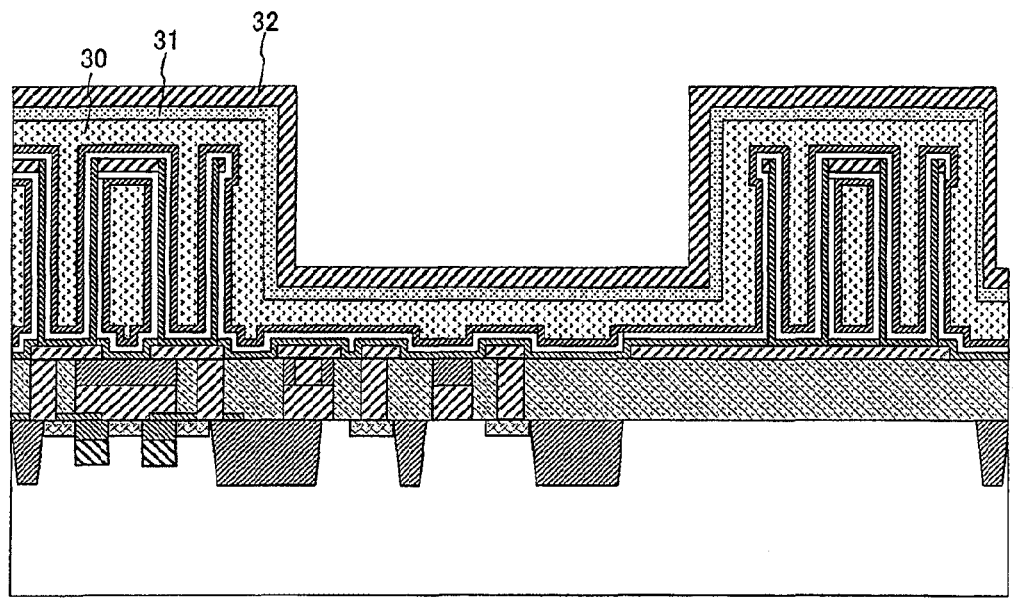
FIG. 25 is a longitudinal sectional view for explaining a process following the process shown in FIG. 24.

Then, as shown in FIG. 25, the adhesive layer 31 and the tungsten (W) film 32 are stacked in this order on the B—SiGe film 30.

The adhesive layer 31 is a B—Si film having a thickness of, for example, 5 nm. The adhesive layer 31, as its name shows, functions as an adhesive layer for ensuring adhesion between the W film 32 and the B—SiGe film 30.

The B—Si film can be formed at 450° C. by CVD using boron trichloride ($BCl_3$) and monosilane ($SiH_4$) as material gases. The B—Si film is amorphous in a high-resistance state at the film formation stage. In order to reduce the resistance, crystallization is required. A heat treatment of 500° C. is required for the crystallization. However, 500° C. corresponds to a temperature at which the reaction between the capacitance insulating film and the TiN film starts to occur. Accordingly, the B—Si film 31 is also limited to a maximum thickness of 10 nm and thus cannot be used as a filling film.

The W film 32 is formed to a thickness of, for example, 100 nm by CVD or sputtering. Sputtering is a physical vapor deposition method and thus basically does not require heating for the film formation. Also in CVD, when the film formation is carried out by reducing $WF_6$ with hydrogen or the like, it can be done at 400° C. or less. The W film 32 has a resistivity which is smaller by about one digit than that of the B—SiGe film 30 or the B—Si film 31, and thus can reduce the thickness as a capacitance plate to about 1/10.

Figure 26:
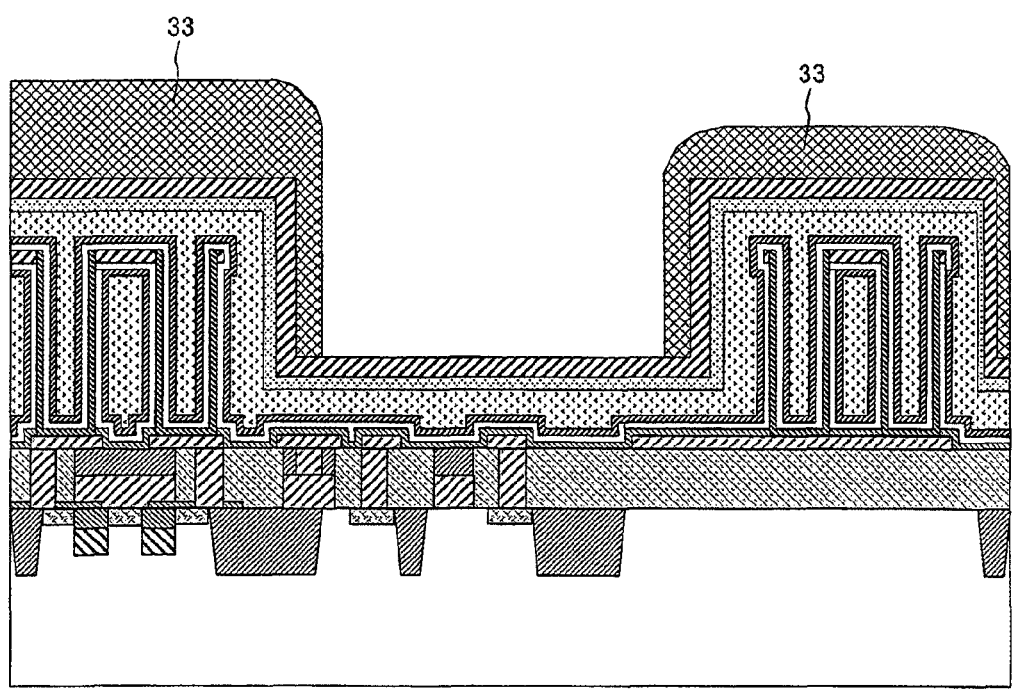
FIG. 26 is a longitudinal sectional view for explaining a process following the process shown in FIG. 25.

Then, as shown in FIG. 26, a photoresist 33 is formed so as to cover the memory cell portion 210 and the compensation capacitance portion 400. The photoresist 33 is used as a mask for removing the W film 32, the adhesive layer 31, and the B—SiGe film 30 which are formed in the peripheral circuit portion 310 and so on.

The formation of the photoresist 33 is carried out by spin-coating a photoresist film on the entire surface of the W film 32 and then patterning the photoresist film by lithography. When the photoresist film is spin-coated, the thickness of the photoresist film formed on the upper surface of the compensation capacitance portion 400 isolatedly present in a wide recess and having a relatively small area becomes smaller than the thickness of the photoresist film formed on the upper surface of the memory cell portion 210 having a relatively large area. This tendency is strong particularly on the shoulder portions of the compensation capacitance portion 400.

Figure 27:
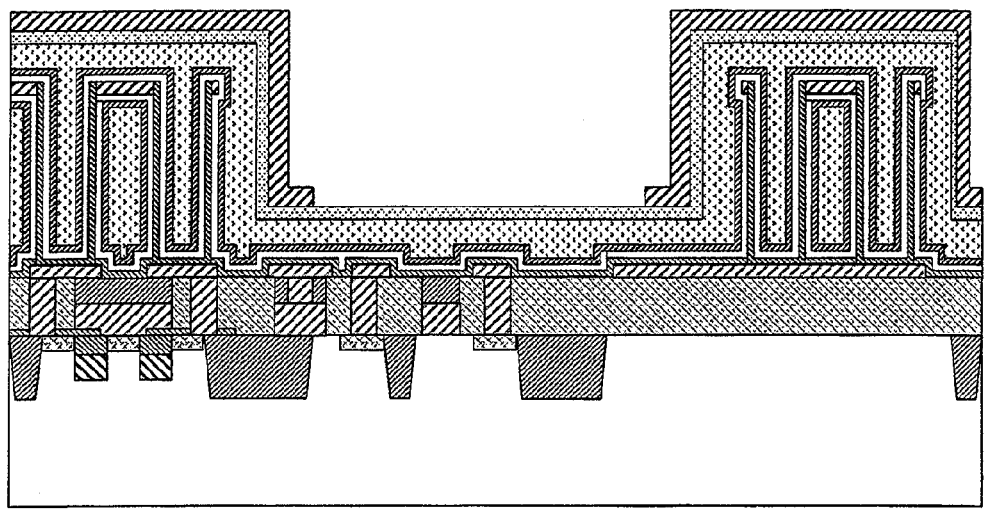
FIG. 27 is a longitudinal sectional view for explaining a process following the process shown in FIG. 26.

Then, as shown in FIG. 27, the W film 32 whose upper surface is exposed in the peripheral circuit portion 310 and so on is dry-etched using the photoresist 33 as a mask. Thereafter, the photoresist 33 used as the mask is removed.

Figure 28:
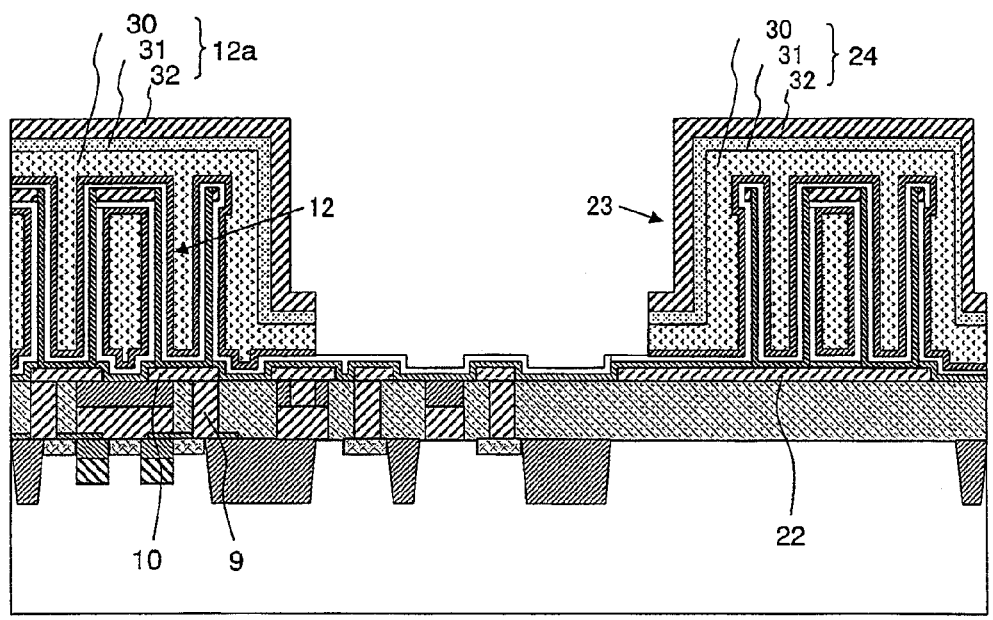
FIG. 28 is a longitudinal sectional view for explaining a process following the process shown in FIG. 27.

Subsequently, as shown in FIG. 28, the adhesive layer 31 and the B—SiGe film 30 are dry-etched using the W film 32 as a mask. The photoresist 33 used as the mask in the preceding process may be used in this process without removing it. Consequently, the cell capacitance plate electrode 12a in the form of the laminated film of the B—SiGe film 30, the adhesive layer 31, and the W film 32 is formed in the memory cell portion 210, while the compensation capacitance upper plate electrode 24 of the same structure is formed in the compensation capacitance portion 400.

Figure 29:
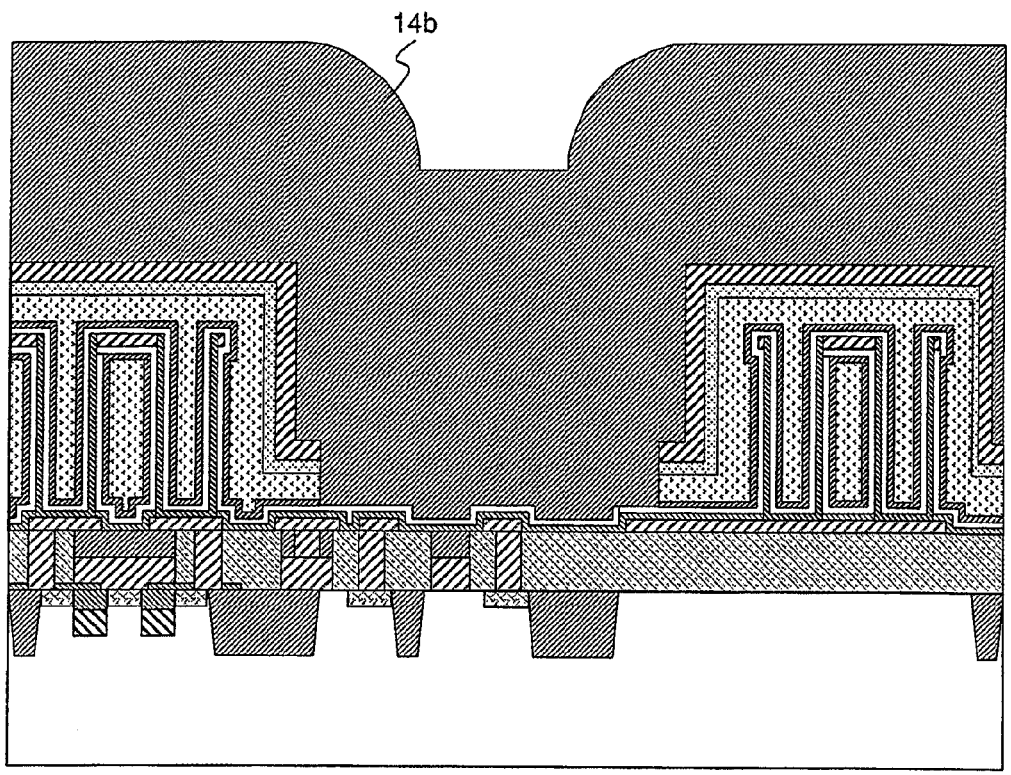
FIG. 29 is a longitudinal sectional view for explaining a process following the process shown in FIG. 28.

Then, as shown in FIG. 29, an insulating film 14b in the form of a silicon oxide film is formed overall by CVD. The insulating film 14b is formed such that the lowest position (a flat surface above the peripheral circuit portion 310) of its surface is located higher than the cell capacitance plate electrode 12a and the compensation capacitance upper plate electrode 24. The thickness of the insulating film 14b may be set to, for example, 1500 nm.

Figure 30:
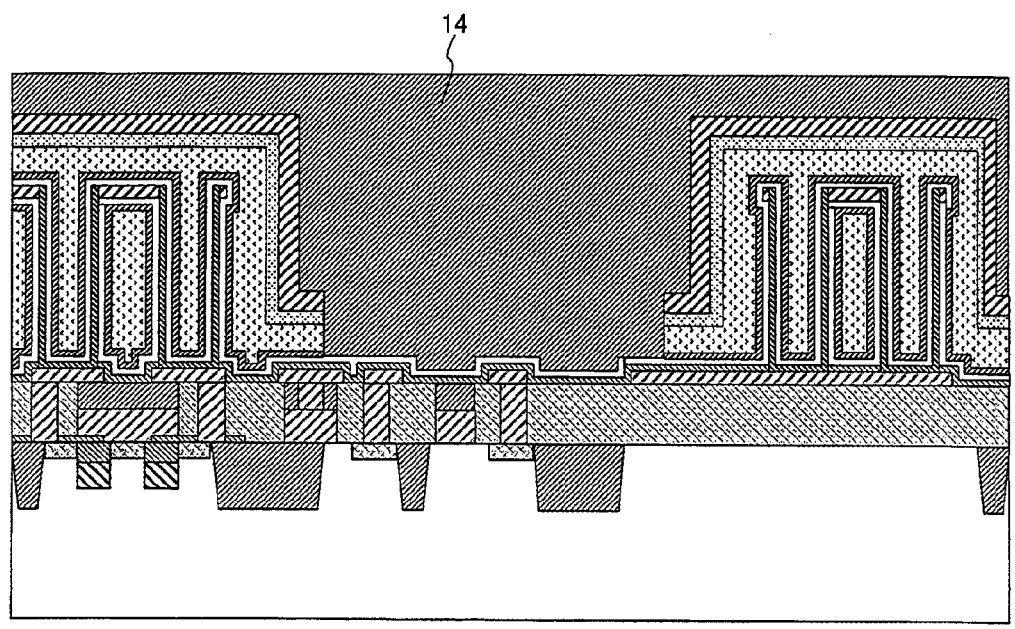
FIG. 30 is a longitudinal sectional view for explaining a process following the process shown in FIG. 29.

Then, as shown in FIG. 30, using CMP, the excessive insulating film 14b formed over the memory cell portion 210 and the compensation capacitance portion 400 is removed and a surface of the insulating film 14b is flattened, thereby forming the second interlayer insulating film 14.

Figure 31:
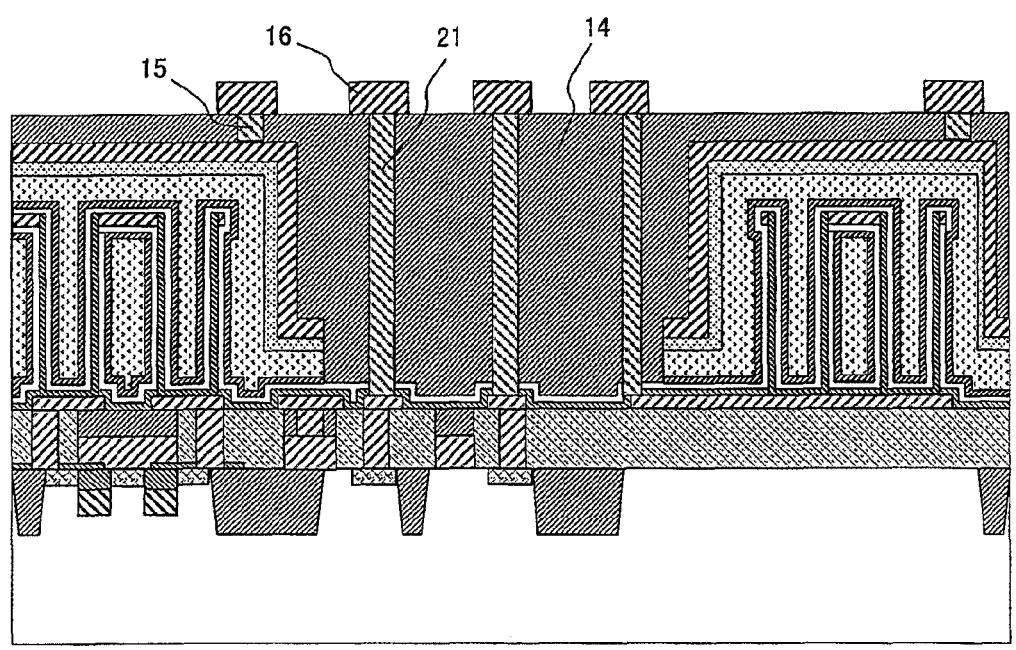
FIG. 31 is a longitudinal sectional view for explaining a process following the process shown in FIG. 30.

Then, as shown in FIG. 31, in the memory cell portion 210 and the compensation capacitance portion 400, first through holes passing through the second interlayer insulating film 14 are formed, thereby exposing part of the upper surface of the W film 32. Simultaneously, in the peripheral circuit portion 310, second through holes passing through the second interlayer insulating film 14 are formed, thereby exposing part of the upper surfaces of the second interconnections 20. Then, the first via plugs 15 are formed in the first through holes and the second via plugs 21 are formed in the second through holes. Further, the third interconnections 16 are formed so as to be respectively connected to the upper surfaces of the first and second via plugs 15 and 21.

Thereafter, interconnection layers and a protective layer are further formed. In this manner, the DRAM is completed.

The above-mentioned semiconductor device is possibly free of a problem of degradation in the insulation of a capacitance insulating film. In addition, since the laminated structure of the B—SiGe film and the metal film is employed as the capacitance plate electrode, the spaces around the crown capacitors can be filled with the conductor at the relatively low temperature (e.g. 450° C.) and further the thickness of the capacitance plate electrode can be reduced. By reducing the thickness of the capacitance plate electrode, it is possible thereafter to achieve facilitation of the formation and flattening of the interlayer insulating film, facilitation of the formation of the through holes, and so on and further to achieve shortening of the process time.

The present invention can also be described as the following supplementary notes.

(Supplementary Note 1) A semiconductor device having, on a single substrate, a memory cell portion and a compensation capacitance portion having different planar surface areas, wherein the memory cell portion and the compensation capacitance portion include capacitance plate electrodes of the same structure and each capacitance plate electrode has a laminated structure comprising a boron-doped silicon germanium film and a metal film.

(Supplementary Note 2) The semiconductor device according to Supplementary Note 1, wherein the metal film is a tungsten film.

(Supplementary Note 3) The semiconductor device according to Supplementary Note 1 or 2, wherein an adhesive layer is provided between the boron-doped silicon germanium film and the metal film.

(Supplementary Note 4) The semiconductor device according to Supplementary Note 3, wherein the adhesive layer is a boron-doped silicon film.

(Supplementary Note 5) The semiconductor device according to any one of Supplementary Notes 1 to 4, wherein the total thickness of the boron-doped silicon germanium film and the metal film is in a range of 120 to 350 nm.

(Supplementary Note 6) The semiconductor device according to Supplementary Note 5, wherein the thickness of the metal film is in a range of 20 to 250 nm.

It is apparent that the present invention is not limited to the above-mentioned embodiment, but may be modified and changed without departing from the scope and spirit of the invention. In particular, the materials of the respective films can be replaced with those that provide the same operations and effects, and the numerical values such as the thickness values are for illustrative purposes only.

What is claimed is:
1. A method of manufacturing a semiconductor device, comprising:
   forming a sacrificial interlayer insulating film over a substrate;
   forming a plurality of cylinder holes in the sacrificial interlayer insulating film positioned in each of a memory cell forming region and a compensation capacitance forming region having different planar surface areas;
   forming a plurality of lower electrodes in the cylinder holes, respectively;
   removing the sacrificial interlayer insulating film so that each of the lower electrodes includes an inner surface and an outer surface;
   forming a capacitance insulating film on the inner and outer surfaces of each of the lower electrodes;
   forming an upper electrode on the capacitance insulating film, thereby a memory cell capacitor is formed in the memory cell forming region and a compensation capacitance is formed in the compensation capacitance forming region, respectively;
   forming at least a metal film as a plate electrode to cover the upper electrode; and
   performing a selective etching on the plate electrode to remove respective portions of the plate electrode which are formed over a region other than the memory cell forming region and the compensation capacitance forming region;

wherein the memory cell capacitor and the compensation capacitance have a same structure, and are simultaneously formed by a same process.

2. The method according to claim 1, wherein the metal film is a tungsten film.

3. The method according to claim 1, wherein a total thickness of the boron-doped silicon germanium film and the metal film is in a range of 120 to 350 nm.

4. The method according to claim 3, wherein a thickness of the metal film is in a range of 20 to 250 nm.

5. The method according to claim 1, further comprising forming a mask film over the metal film, the selective etching being performed by use of the mask film, and the forming the mask film comprising:

forming a photoresist film by spin coating over the metal film; and patterning the photoresist film by lithography to form the mask film.

6. The method according to claim 5, wherein the performing the selective etching comprises:

partially etching the metal film using the mask film as a mask; and etching the boron-doped silicon germanium film using a remaining portion of the metal film as a mask.

7. The method according to claim 1, further comprising forming a boron-doped silicon germanium film before forming the metal film.

8. The method according to claim 7, further comprising forming an adhesive layer on the boron-doped silicon germanium film before forming the metal film.

9. The method according to claim 8, wherein the adhesive layer is a boron-doped silicon film that is substantially free from germanium.

10. The method according to claim 9, further comprising forming a mask film over the metal film, the selective etching being performed by use of the mask film, and the forming the mask film comprising:

forming a photoresist film by spin coating; and patterning the photoresist film by lithography to form the mask film.

11. The method according to claim 10, wherein the performing the selective etching, comprises:

partially etching the metal film using the mask film as a mask; and etching the boron-doped silicon film and the boron-doped silicon germanium film using a remaining portion of the metal film as a mask.

* * * * *